(12) United States Patent
Nakatogawa

(10) Patent No.: US 11,874,572 B2
(45) Date of Patent: Jan. 16, 2024

(54) ELECTRONIC DEVICE

(71) Applicant: Japan Display Inc., Tokyo (JP)

(72) Inventor: Hirondo Nakatogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/872,069

(22) Filed: Jul. 25, 2022

(65) Prior Publication Data

US 2022/0357625 A1 Nov. 10, 2022

Related U.S. Application Data

(63) Continuation of application No. PCT/JP2020/047428, filed on Dec. 18, 2020.

(30) Foreign Application Priority Data

Jan. 27, 2020 (JP) ................................. 2020-010966

(51) Int. Cl.
*G02F 1/1362* (2006.01)
*G02F 1/1335* (2006.01)
(Continued)

(52) U.S. Cl.
CPC ...... *G02F 1/136209* (2013.01); *G02F 1/1368* (2013.01); *G02F 1/133345* (2013.01);
(Continued)

(58) Field of Classification Search
CPC ............ G02F 1/1333; G02F 1/133331; G02F 1/1335; G02F 1/133512; G02F 1/133514; G02F 1/133524; G02F 1/133528; G02F 1/1337; G02F 1/1343; G02F 1/134309; G02F 1/1362; G02F 1/136209; G02F 1/136286; G02F 1/1368; G02F 2201/52; G06V 40/1318; G06V 10/12;
(Continued)

(56) References Cited

U.S. PATENT DOCUMENTS

| | | |
|---|---|---|
| 2017/0053592 A1 | 2/2017 | Shin et al. |
| 2017/0235398 A1 | 8/2017 | Choi et al. |
| 2019/0384121 A1 | 12/2019 | Nishiwaki et al. |

FOREIGN PATENT DOCUMENTS

| | | | |
|---|---|---|---|
| CN | 109285466 A | 1/2019 | |
| CN | 208384467 | * 1/2019 | ............... G06F 1/16 |
| CN | 110515243 A | 11/2019 | |

OTHER PUBLICATIONS

Patent Translate CN 208384467 (Sun Jingyang, Jan. 15, 2019).*
(Continued)

*Primary Examiner* — Thoi V Duong
(74) *Attorney, Agent, or Firm* — Michael Best & Friedrich LLP

(57) ABSTRACT

According to one embodiment, an electronic device includes an imaging device, and a liquid crystal panel including a display portion overlapping the imaging device, wherein the liquid crystal panel includes a first pixel overlapping the imaging device, an opening portion provided in the first pixel, a second pixel adjacent to the first pixel, and a third pixel adjacent to the second pixel, the third pixel includes a first coloring layer, a second coloring layer and a third coloring layer, and the second pixel does not include the coloring layer or includes a transparent resinous layer.

18 Claims, 30 Drawing Sheets

(51) Int. Cl.
   *G02F 1/1333*    (2006.01)
   *G02F 1/1343*    (2006.01)
   *G02F 1/1368*    (2006.01)
   *H10K 50/86*     (2023.01)
   *H10K 59/65*     (2023.01)
   *H10K 59/131*    (2023.01)

(52) U.S. Cl.
   CPC ..... *G02F 1/136286* (2013.01); *H10K 50/865* (2023.02); *H10K 59/131* (2023.02); *H10K 59/65* (2023.02); *G02F 1/133512* (2013.01); *G02F 1/133514* (2013.01)

(58) Field of Classification Search
   CPC .... H10K 50/865; H10K 59/131; H10K 59/65; H10K 59/126; H10K 59/352
   See application file for complete search history.

(56) References Cited

OTHER PUBLICATIONS

International Search Report dated Mar. 2, 2021 for PCT Application PCT/JP2020/047428, with English translation.
Chinese Office Action dated Jul. 1, 2023, for the corresponding Chinese Application No. 202080094127.8.

\* cited by examiner

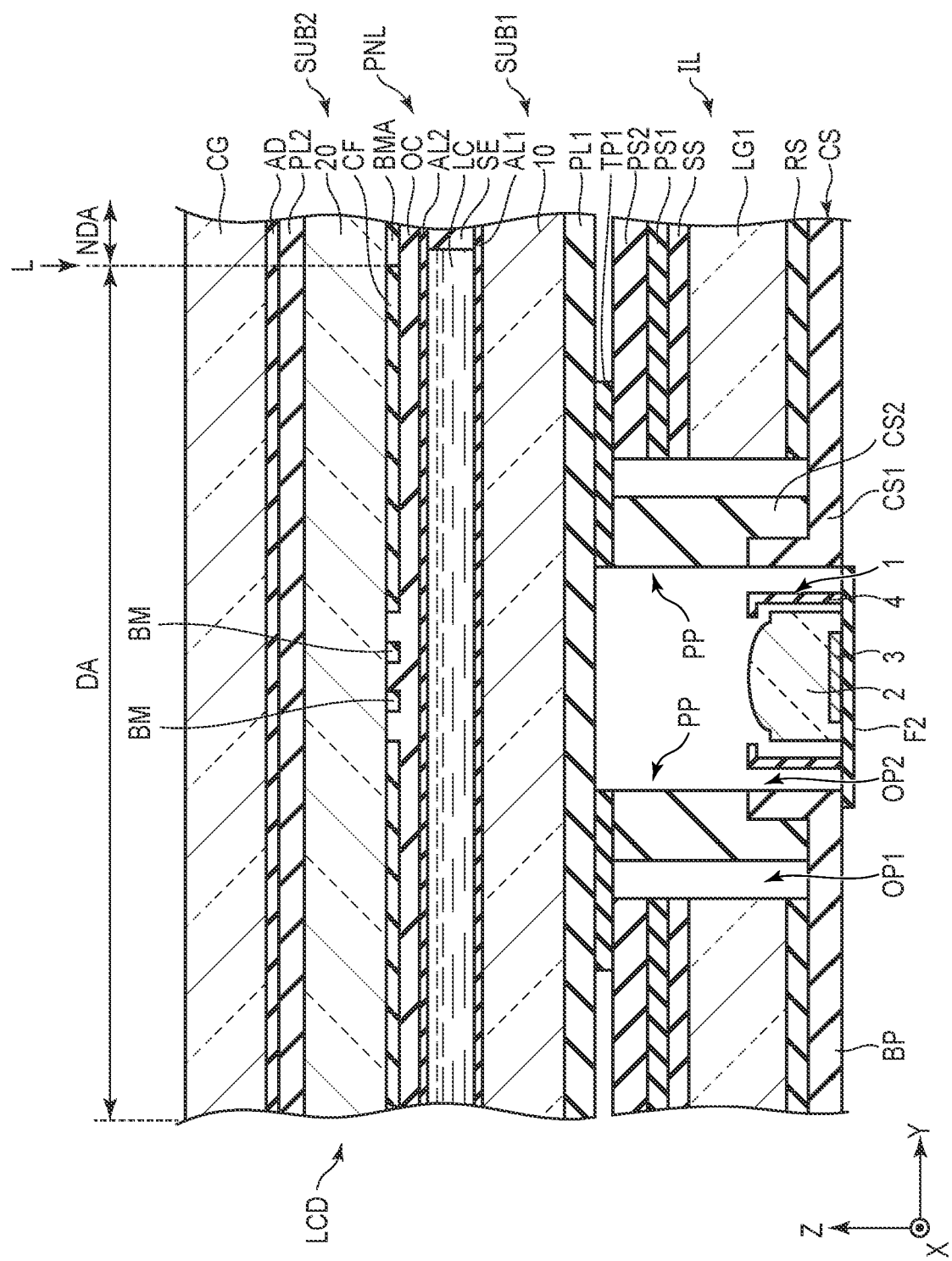
F I G. 2

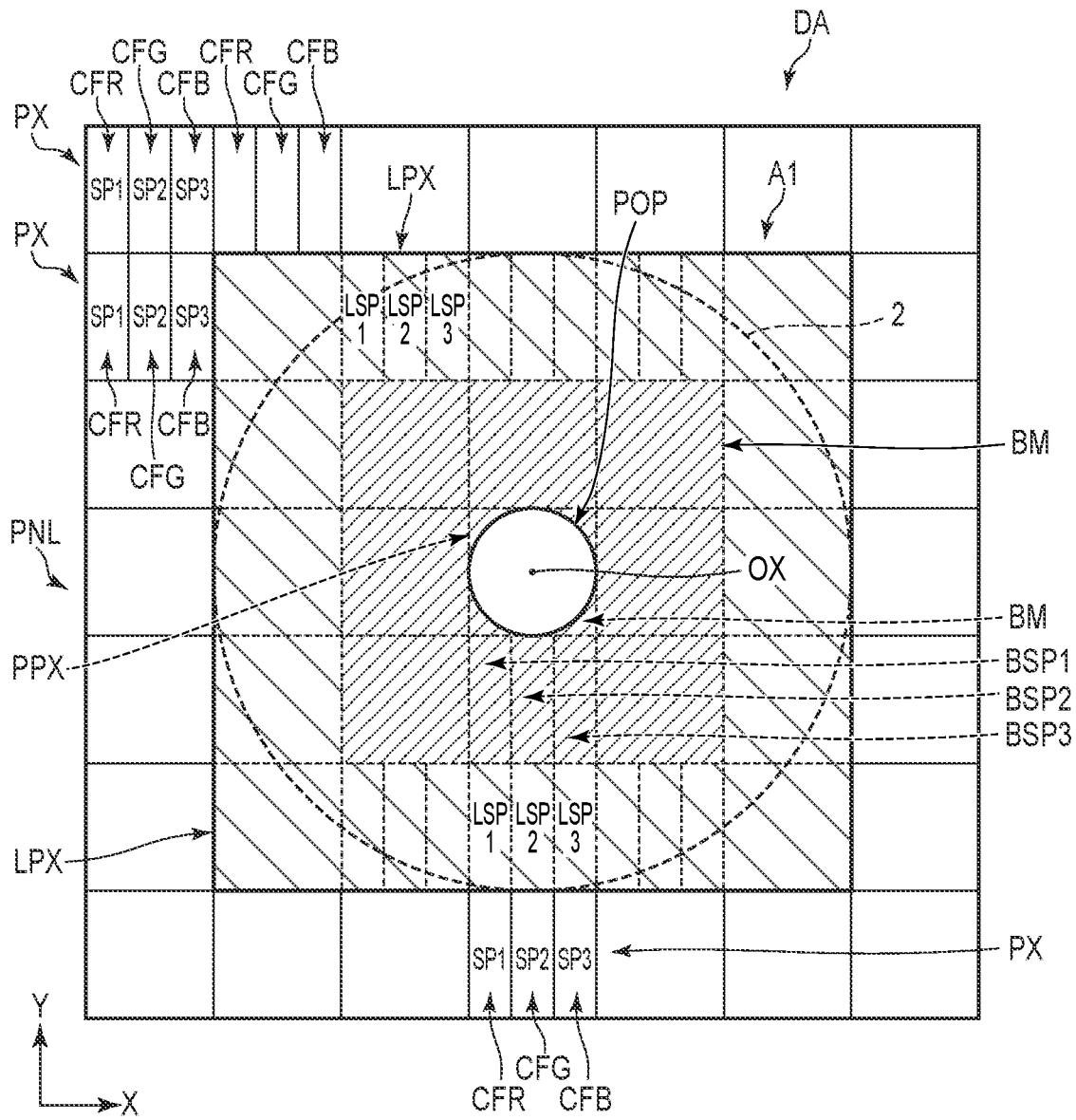
F I G. 4

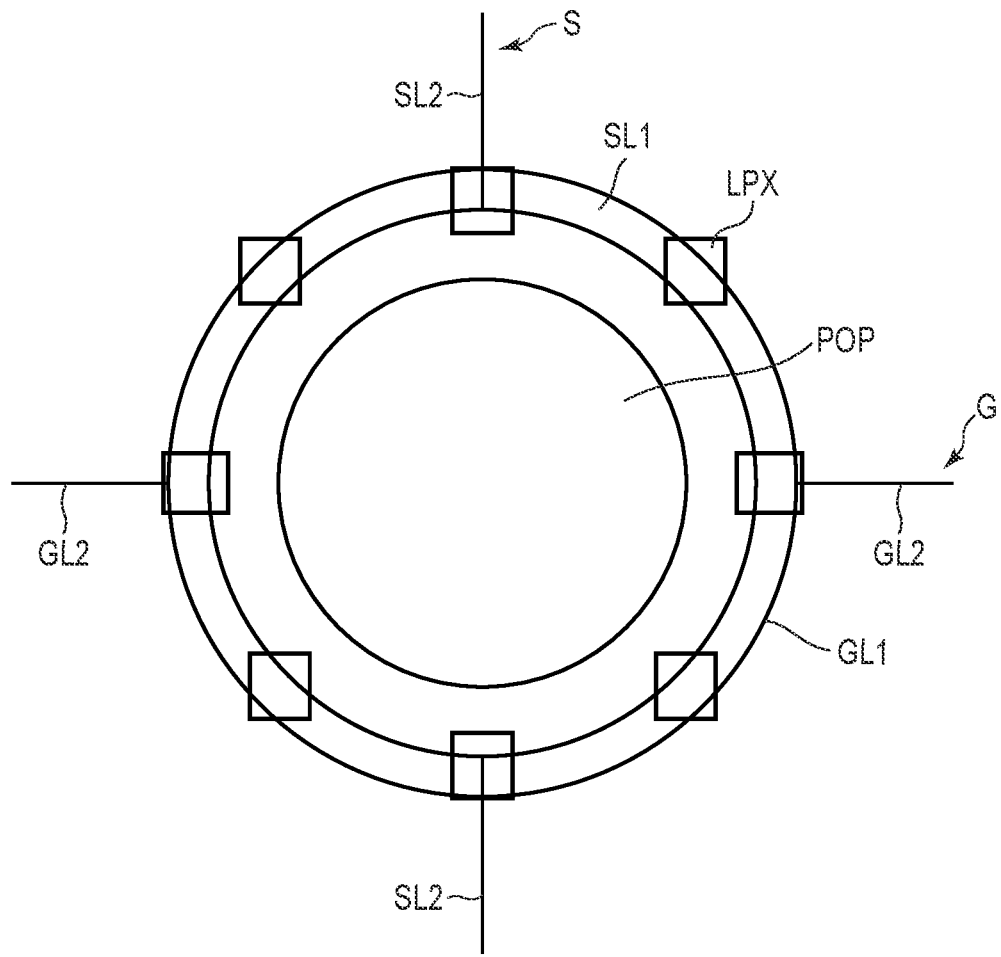
F I G. 16

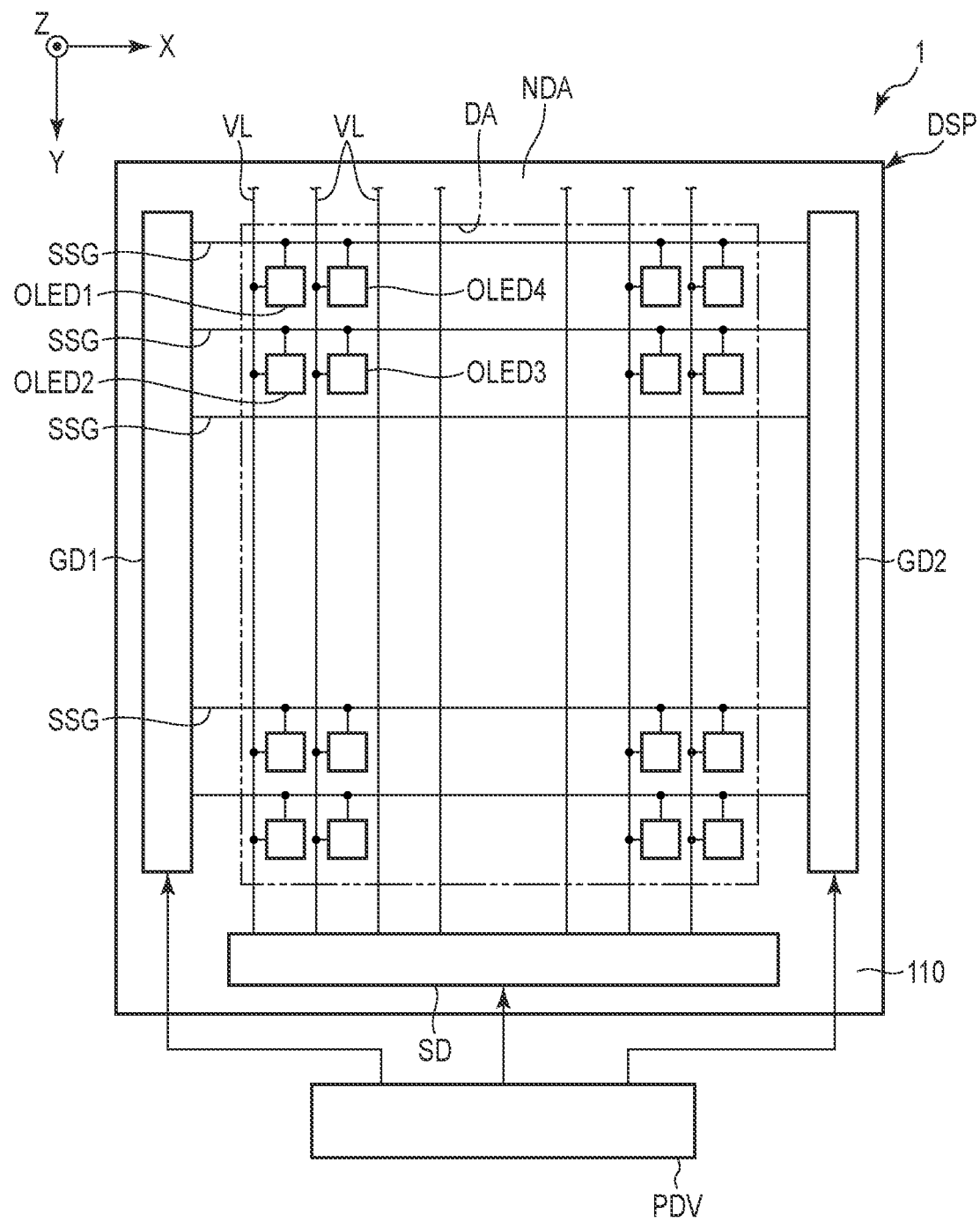
F I G. 21

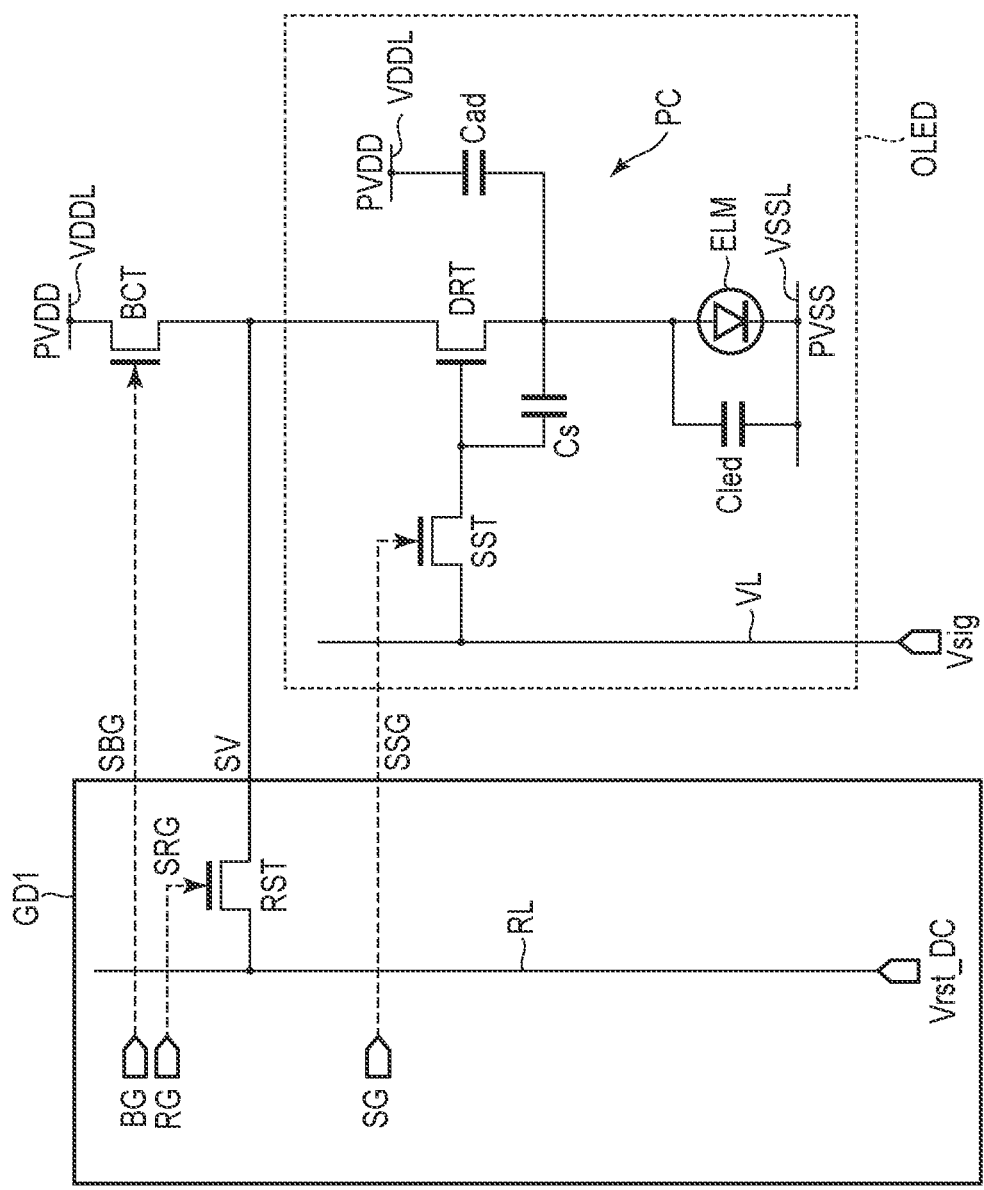
F I G. 22

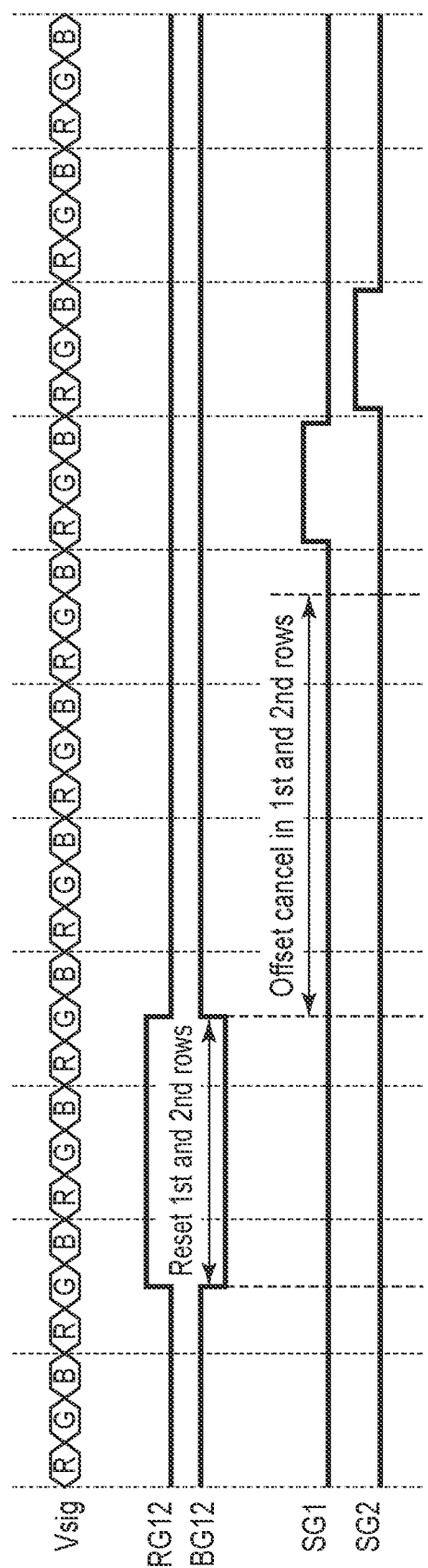
F I G. 24

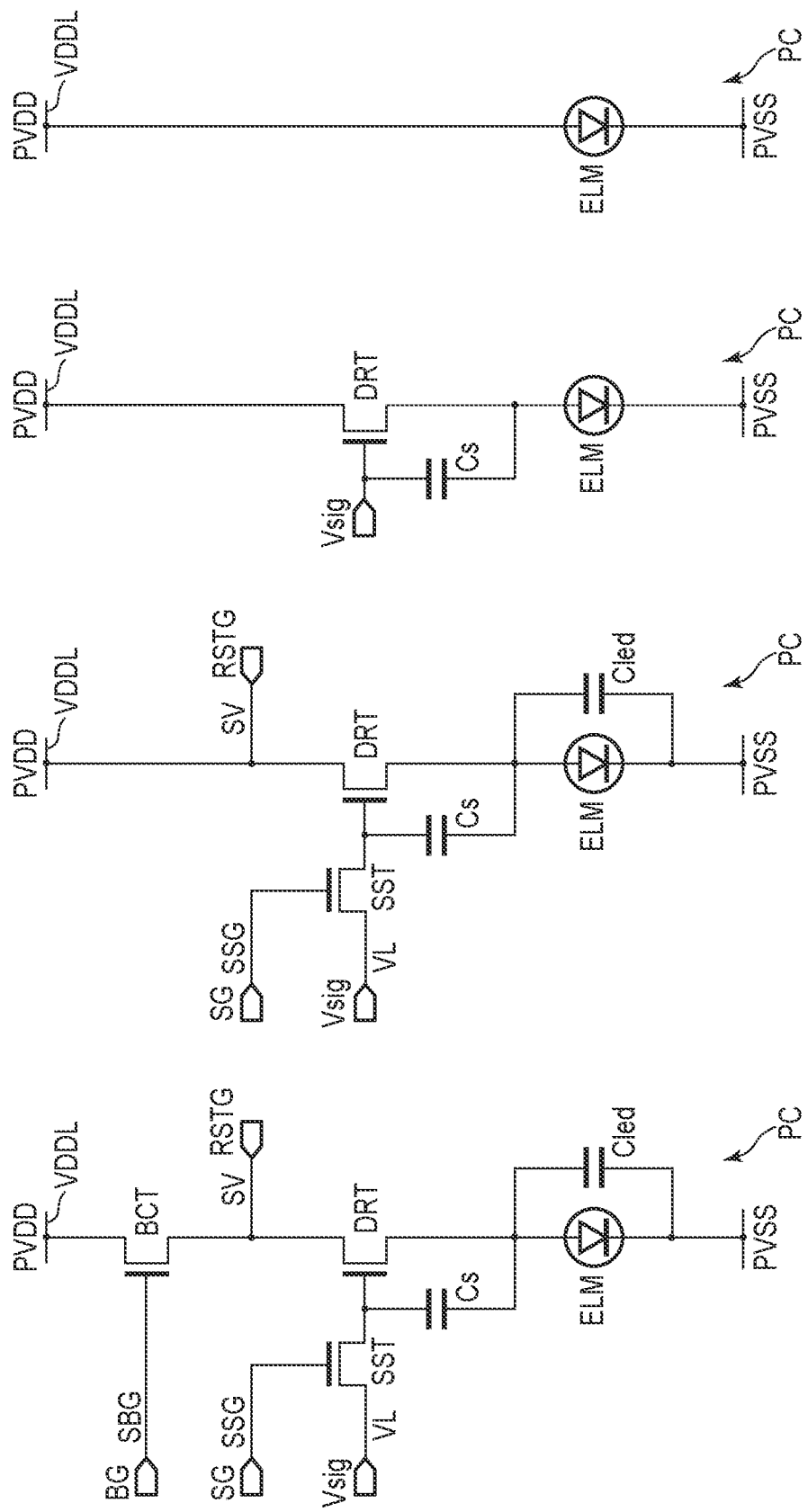

ELECTRONIC DEVICE

CROSS-REFERENCE TO RELATED APPLICATIONS

This application is a Continuation application of PCT Application No. PCT/JP2020/047428, filed Dec. 18, 2020, and based upon and claiming the benefit of priority from Japanese Patent Application No. 2020-010966, filed Jan. 27, 2020, the entire contents of all of which are incorporated herein by reference.

FIELD

Embodiments described herein relate generally to an electronic device.

BACKGROUND

In recent years, electronic devices such as a smartphone comprising a display portion and an imaging element on the same side have been widely put into practical use. In this type of electronic device, an imaging element is provided outside a display portion. A demand for the reduction in the frame width of the outside of the display portion while securing a space for provision of the imaging element has increased.

Moreover, a technology in which a clear picture can be taken by the imaging element has been required.

BRIEF DESCRIPTION OF THE DRAWINGS

FIG. 2 is a cross-sectional view around the imaging device 1 of the electronic device 100 shown in FIG. 1.

FIG. 4 is an enlarged plan view of the liquid crystal panel PNL shown in FIG. 3.

FIG. 16 is a diagram showing another configuration example of a pixel LPX.

FIG. 21 is a plan view showing the circuit configuration of a display panel DSP.

FIG. 22 is a plan view showing the circuit configuration of the display panel DSP.

FIG. 24 is a timing diagram showing an output example of various types of signals related to a reset operation, an offset cancel operation, a write operation and an emission operation in an organic EL element OLED.

FIG. 33A is a diagram showing another configuration example of a pixel circuit PC according to the present embodiment.

FIG. 33B is a diagram showing another configuration example of the pixel circuit PC according to the present embodiment.

FIG. 33C is a diagram showing another configuration example of the pixel circuit PC according to the present embodiment.

FIG. 33D is a diagram showing another configuration example of the pixel circuit PC according to the present embodiment.

DETAILED DESCRIPTION

Figure 1:
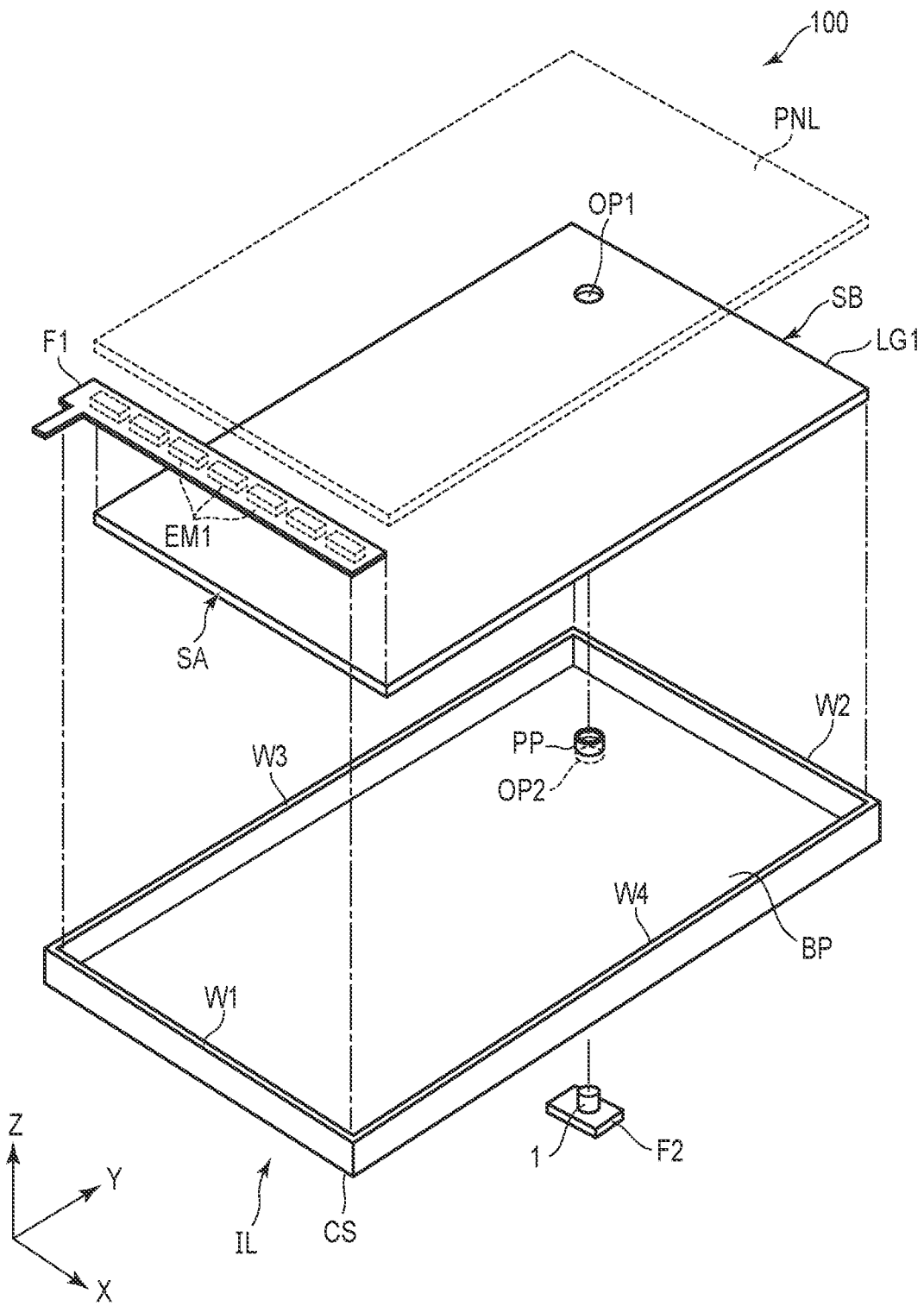
FIG. 1 is an exploded perspective view showing a configuration example of an electronic device 100 according to embodiment 1.

In general, according to one embodiment, an electronic device comprises an imaging device; and a liquid crystal panel comprising a display portion overlapping the imaging device, wherein the liquid crystal panel comprises: a first pixel overlapping the imaging device; an opening portion provided in the first pixel; a second pixel adjacent to the first pixel; and a third pixel adjacent to the second pixel, the third pixel comprises a first coloring layer, a second coloring layer and a third coloring layer, and the second pixel does not comprise the coloring layer or comprises a transparent resinous layer.

According to another embodiment, an electronic device comprises an imaging device; and an organic EL panel comprising a display portion overlapping the imaging device, wherein the organic EL panel comprises: a first pixel overlapping the imaging device; an opening portion provided in the first pixel; a second pixel adjacent to the first pixel; and a third pixel adjacent to the second pixel, the third pixel comprises a first coloring layer, a second coloring layer and a third coloring layer, and the second pixel comprises a transparent resinous layer.

The present embodiment provides an electronic device which can capture a clear image.

Each embodiment of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Hereinafter, an electronic device of an embodiment is explained in detail with reference to the accompanying drawings.

In the present embodiment, a first direction X, a second direction Y and a third direction Z are perpendicular to one another. However, they may intersect one another at an angle other than 90 degrees. The third direction Z is defined as an upward direction or an upper side. The opposite direction of the third direction Z is defined as a downward direction or a lower side.

When this specification uses the phrases "a second member above a first member" and "a second member under a first member", the second member may be in contact with the first member, or may be spaced apart from the first member. In the latter case, a third member may be interposed between the first member and the second member. When this specification uses the phases "a second member on a first member" and "a second member on the lower side of a first member", the second member is in contact with the first member.

Embodiment 1

FIG. 1 is an exploded perspective view showing a configuration example of an electronic device 100 according to the present embodiment.

The electronic device 100 comprises a liquid crystal panel PNL, an illumination device IL and an imaging device 1.

The illumination device IL comprises a light guide LG1, light sources EM1 and a case CS. For example, the illumination device IL illuminates the liquid crystal panel PNL shown by broken lines in a simplified manner in FIG. 1.

The light guide LG1 is formed in a flat-plate shape parallel to the X-Y plane defined by a first direction X and a second direction Y. The light guide LG1 faces the liquid crystal panel PNL. The light guide LG1 comprises a side surface SA, a side surface SB on the opposite side of the side surface SA, and an opening portion OP1. Each of the side surfaces SA and SB extends in the first direction X. For example, the side surfaces SA and SB are faces parallel to the X-Z plane defined by the first direction X and a third direction Z.

The opening portion OP1 is a through-hole which penetrates the light guide LG1 in the third direction Z. In the second direction Y, the opening portion OP1 is located between the side surfaces SA and SB and is closer to the side surface SB than the side surface SA. It should be noted that the opening portion OP1 may be a concave portion or a notch depressed from the side surface SB toward the side surface SA.

The light sources EM1 are arranged at intervals in the first direction X. Each of the light sources EM1 is mounted on a wiring board F1 and is electrically connected to the wiring board F1. Each light source EM1 is, for example, a light emitting diode (LED) and emits white illumination light. The illumination light emitted from each light source EM1 enters the light guide LG1 from the side surface SA and proceeds from the side surface SA toward the side surface SB.

The case CS accommodates the light guide LG1 and the light sources EM1. The case CS comprises sidewalls W1 to W4, a bottom plate BP, an opening portion OP2 and a protruding portion PP. The sidewalls W1 and W2 extend in the first direction X and face each other. The sidewalls W3 and W4 extend in the second direction Y and face each other.

The opening portion OP2 overlaps the opening portion OP1 in the third direction Z. The protruding portion PP protrudes from the bottom plate BP toward the liquid crystal panel PNL in the third direction Z and is provided so as to surround the opening portion OP2.

The imaging device 1 is provided so as to overlap the opening portion OP2 in the third direction Z. The imaging device 1 is mounted on a wiring board F2 and is electrically connected to the wiring board F2.

The liquid crystal panel PNL overlaps the light guide LG1, and overlaps the imaging device 1 in the opening portion OP1.

FIG. 2 is a cross-sectional view around the imaging device 1 of the electronic device 100 shown in FIG. 1.

The locational relationships of the optical system 2, the color filter CF, the light-shielding layer BMA and the light-shielding layer BM shown in FIG. 2 are not explained here, and details are described later.

As shown in FIG. 2, the illumination device IL further comprises a reflective sheet RS, a diffusion sheet SS and prism sheets PS1 and PS2.

The reflective sheet RS, the light guide LG1, the diffusion sheet SS, the prism sheet PS1 and the prism sheet PS2 are provided in this order in the third direction Z, and are accommodated in the case CS. The case CS comprises a metal case CS1 and a resinous pedestal CS2. The pedestal CS2 forms the protruding portion PP with the case CS1. Each of the diffusion sheet SS, the prism sheet PS1 and the prism sheet PS2 comprises a through-hole overlapping the opening portion OP1. The reflective sheet RS comprises a through-hole overlapping the opening portion OP1. The protruding portion PP is located inside the opening portion OP1.

A polarizer PL1, the liquid crystal panel PNL, a polarizer PL2 and a cover glass CG are provided in this order in the third direction Z and constitute a liquid crystal element LCD comprising an optical switch function relative to light which proceeds in the third direction Z. The illumination device IL is attached to the liquid crystal element LCD by an adhesive tape TP1. In the present embodiment, by the adhesive tape TP1, the polarizer PL1 is attached to the protruding portion PP, and the polarizer PL1 is attached to the prism sheet PS2.

The liquid crystal panel PNL may comprise a configuration corresponding to any one of a display mode using a lateral electric field along the main surfaces of the substrates, a display mode using a longitudinal electric field along the normal of the main surfaces of the substrates, a display mode using an inclined electric field inclined at a tilt with respect to the main surfaces of the substrates and a display mode appropriately combining the above lateral electric field, longitudinal electric field and inclined electric field. Here, the main surfaces of the substrates are faces parallel to the X-Y plane.

The liquid crystal panel PNL comprises a display portion DA which displays images, and a non-display portion NDA which surrounds the display portion DA. The liquid crystal panel PNL comprises a first substrate SUB1, a second substrate SUB2, a liquid crystal layer LC and a sealing element SE. The sealing element SE is located in the non-display portion NDA. The first substrate SUB1 is attached to the second substrate SUB2 by the sealing element SE. The sealing element SE seals the liquid crystal layer LC.

Hereinafter, the main portions of the first substrate SUB1 and the second substrate SUB2 are explained. The first substrate SUB1 comprises an insulating substrate 10 and an alignment film AL1. The second substrate SUB2 comprises an insulating substrate 20, the color filter CF, the light-shielding layer BMA, a transparent layer OC and an alignment film AL2.

The insulating substrate 10 and the insulating substrate 20 are transparent substrates such as a glass substrate or a flexible resinous substrate. The alignment films AL1 and AL2 are in contact with the liquid crystal layer LC.

The color filter CF, the light-shielding layer BMA and the transparent layer OC are located between the insulating substrate 20 and the liquid crystal layer LC in the third direction Z. In the example shown in the figure, the color filter CF is provided in the second substrate SUB2. However, the color filter CF may be provided in the first substrate SUB1.

Here, the details of the color filter CF are omitted. Briefly, the color filter CF comprises, for example, a red color filter provided in a red pixel, a green color filter provided in a green pixel and a blue color filter provided in a blue pixel. The color filter CF may comprise a transparent resinous layer provided in a white pixel. The transparent layer OC covers the color filter CF and the light-shielding layer BMA. The transparent layer OC is, for example, a transparent organic insulating layer.

The light-shielding layer BMA is located in the non-display portion NDA. The boundary L between the display portion DA and the non-display portion NDA is defined by, for example, the inner edge of the light-shielding layer BMA (the edge portion on the display portion DA side). The sealing element SE is provided in a location overlapping the light-shielding layer BMA.

The alignment films AL1 and AL2 are provided over the display portion DA and the non-display portion NDA.

The imaging device 1 is provided so as to overlap the opening portion OP2 of the case CS, and is located inside the protruding portion PP such that the imaging device 1 is surrounded by the protruding portion PP. The imaging device 1 overlaps the cover glass CG, the polarizer PL2, the liquid crystal panel PNL and the polarizer PL1 in the third direction Z.

The imaging device 1 partly or entirely overlaps the display portion DA of the liquid crystal panel PNL in the third direction Z. In the electronic device 100 comprising the liquid crystal panel PNL and the imaging device 1, the imaging device 1 should be at least provided on the back of the liquid crystal panel PNL when viewed from the user of the electronic device 100.

The imaging device 1 comprises, for example, the optical system 2 including at least one lens, an image sensor (imaging element) 3 and a case 4. The case 4 accommodates the optical system 2 and the image sensor 3. The optical system 2 is located between the liquid crystal panel PNL and the image sensor 3. The image sensor 3 receives light via the cover glass CG, the polarizer PL2, the liquid crystal panel PNL and the polarizer PL1.

For example, the imaging device 1 receives visible light (for example, light in the range of 400 to 700 nm) which passed through the cover glass CG, the polarizer PL2, the display portion DA, the polarizer PL1 and a light guide LG2. When the absorption axis of the polarizer PL1 and the absorption axis of the polarizer PL2 are orthogonal to each other, and the wavelength of light which passes through the liquid crystal layer LC of the liquid crystal element LCD is $\lambda$, and the retardation of the liquid crystal layer LC is almost zero or equivalent to $\lambda$, the transmittance of the liquid crystal element LCD is a minimum.

For this reason, when an image is captured by the imaging device 1, the retardation of the liquid crystal layer LC is set so as to be greater than zero and less than $\lambda$. When the retardation is approximately $\lambda/2$, the transmittance of the liquid crystal element LCD is a maximum.

The polarizer PL1 is attached to the insulating substrate 10. The polarizer PL2 is attached to the insulating substrate 20. The polarizer PL2 is attached to the cover glass CG by a transparent adhesive layer AD. The polarizers PL1 and PL2 may comprise a retardation film, a scattering layer, an antireflective layer, etc., depending on the need.

In some cases, to prevent the liquid crystal layer LC from being affected by an external electric field, etc., a transparent conductive film is provided between the polarizer PL2 and the insulating substrate 20. The transparent conductive film is formed by a transparent oxide conductor such as indium tin oxide (ITO) or indium zinc oxide (IZO). In a portion overlapping the camera 1 for visible light in which infrared transmittance is not a problem, a transparent conductive film may be formed.

An ultra-birefringent film may be provided in the polarizer PL1 or the polarizer PL2. The ultra-birefringent film is known to convert transmitted light into unpolarized light (natural light) when linearly polarized light enters the film. Even if the object contains an element which emits polarized light, an image can be captured without a feeling of strangeness.

For example, when the electronic device 100, etc., is reflected as the object of the imaging device 1, since linearly polarized light is emitted from the electronic device 100, because of the relationship with the angle between the polarizers PL1 and PL2 and the polarizer of the electronic device 100 which is the object, the brightness of the electronic device 100 as the object which emits light to the imaging device 1 may be changed. Thus, a feeling of strangeness may be caused when an image is captured. However, when an ultra-birefringent film is provided in the polarizer PL1 and the polarizer PL2, the change in brightness which causes a feeling of strangeness can be prevented.

Figure 3:
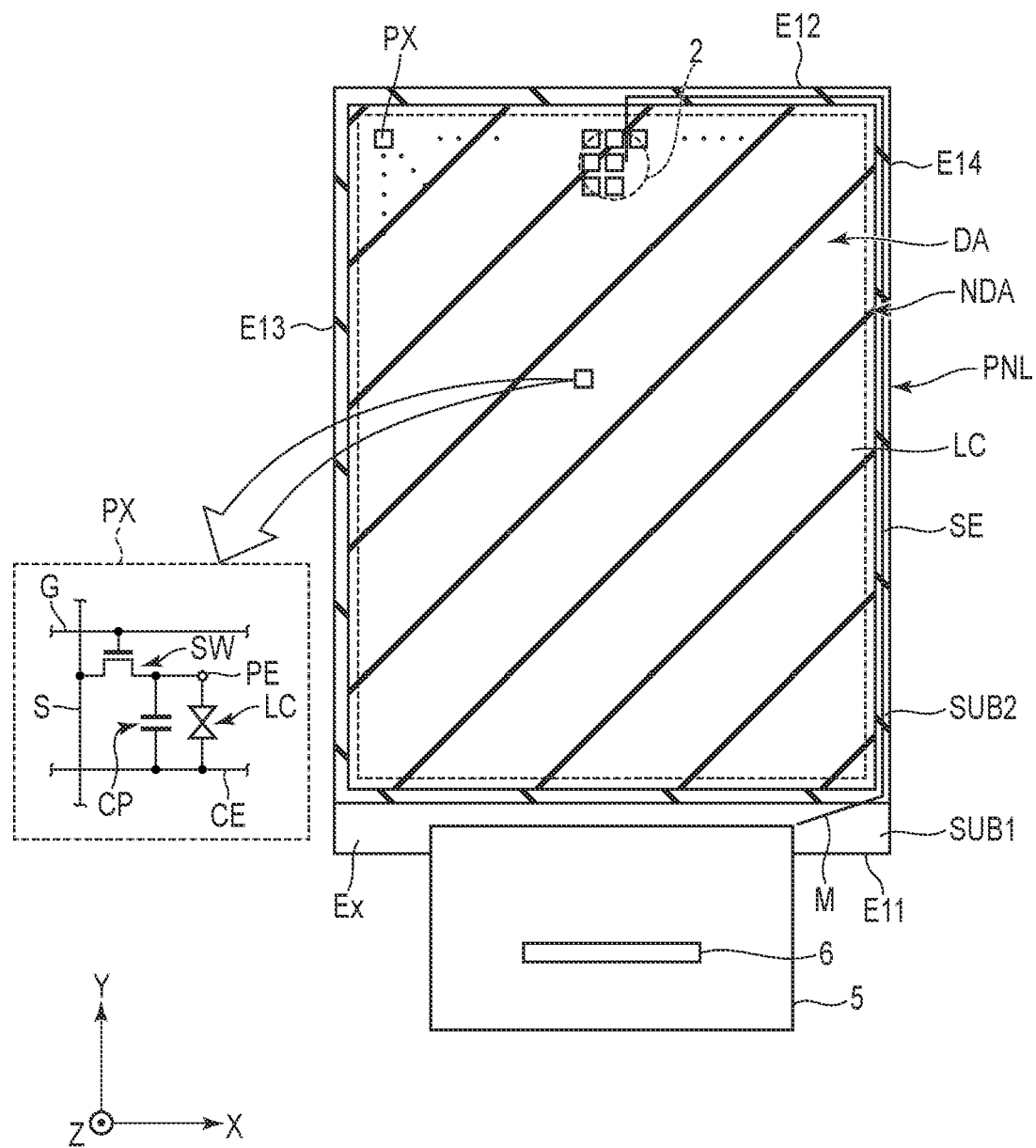
FIG. 3 is a plan view showing a configuration example of the liquid crystal panel PNL shown in FIG. 2.

FIG. 3 is a plan view showing a configuration example of the liquid crystal panel PNL shown in FIG. 2. In FIG. 3, the liquid crystal layer LC and the sealing element SE are shown by different hatch lines. The outline of the optical system 2 of the imaging device 1 is shown by a broken line.

As shown in FIG. 3, the display portion DA is substantially a rectangular area which does not include a notch. However, the four corners may be rounded. The display portion DA may not be rectangular, and for example, may be polygonal or circular. The display portion DA is located inside the sealing element SE such that the display portion DA is surrounded by the sealing element SE.

The liquid crystal panel PNL comprises a pair of short sides E11 and E12 extending in the first direction X, and a pair of long sides E13 and E14 extending in the second direction Y. In the display portion DA, the liquid crystal panel PNL comprises a plurality of pixels PX arrayed in matrix in the first direction X and the second direction Y. The pixels PX in the display portion DA comprise the same circuit configuration.

As shown in the enlarged view of FIG. 3, each pixel PX comprises a switching element SW, a pixel electrode PE, a common electrode CE, a liquid crystal layer LC, etc. The switching element SW is configured by, for example, a transistor, more specifically, a thin-film transistor (TFT), and is electrically connected to a scanning line G and a signal line S. A control signal for controlling the switching element SW is supplied to the scanning line G.

A video signal is supplied to the signal line S as a signal different from a control signal. The pixel electrode PE is electrically connected to the switching element SW. The liquid crystal layer LC is driven by an electric field generated between the pixel electrode PE and the common electrode CE. For example, capacitance CP is formed between an electrode having the same potential as the common electrode CE and an electrode having the same potential as the pixel electrode PE.

A wiring board 5 is mounted in the extending portion Ex of the first substrate SUB1 and is electrically connected to the extending portion Ex. An IC chip 6 is mounted in the wiring board 5 and is electrically connected to the wiring board 5. It should be noted that the IC chip 6 may be mounted in the extending portion Ex and electrically connected to the extending portion Ex. The IC chip 6 comprises, for example, a built-in display driver which outputs signals necessary for image display. The wiring board 5 is a flexible printed circuit which can be bent.

In the first substrate SUB1, a metal line M is electrically connected to the IC chip 6. The metal line M extends between the display portion DA and the short side E11, between the display portion DA and the long side E14 and between the display portion DA and the short side E12, and overlaps the optical system 2. In the example shown in the figure, the sealing element SE overlaps the metal line M.

FIG. 4 is an enlarged plan view of the liquid crystal panel PNL shown in FIG. 3. As shown in FIG. 4, the display portion DA comprises an area A1 overlapping the optical system 2.

Each pixel PX comprises subpixels SP1 to SP3. In any pixel PX, the subpixels SP1, SP2 and SP3 are arrayed in the same manner. In the first direction X, a subpixel SP1, a subpixel SP2 and a subpixel SP3 are repeatedly arranged in this order.

The above color filter CF comprises coloring layers CFR, CFG and CFB. Each subpixel SP1 comprises a coloring layer CFR having a first color (hereinafter, it also called as a first coloring layer). Each subpixel SP2 comprises a coloring layer CFG having a second color (hereinafter, it also called as a second coloring layer). Each subpixel SP3 comprises a coloring layer CFB having a third color (hereinafter, it also called as a third coloring layer). The first color of the coloring layer CFR, the second color of the coloring layer CFG and the third color of the coloring layer CFB are different colors.

In the present embodiment, the first color is red (R). The second color is green (G). The third color is blue (B). It should be noted that these first color, second color and third color are merely examples and may be modified in various ways. One of the first color, the second color and the third color should be red, and another color should be green, and the remaining color should be blue. The third color of some coloring layers maybe, for example, white (W).

A pixel PPX faces the opening portion OP1 and overlaps the center OX of the optical system 2. The pixel PPX is configured without a coloring layer. When the color filter CF comprises a transparent resinous layer, the pixel PPX may comprise a transparent resinous layer (coloring layer CFW).

The light-shielding layer BM overlaps a part of the pixel PPX. In FIG. 4, the light-shielding layer BM overlapping the pixels PX other than the pixel PPX is omitted. The light-shielding layer BM is formed integrally with the light-shielding layer BMA of the non-display portion NDA shown in FIG. 2. The light-shielding layer BM comprises an opening portion POP. In the example shown in the figure, the center of the opening portion POP overlaps the center OX of the optical system 2. As seen in plan view, the opening portion POP is concentric with the optical system 2. The opening portion POP is formed roundly. The opening portion POP should be preferably formed in a perfect circle.

In some cases, the pixel PPX is not used for display. Thus, in a precise sense, the term "pixel" is incorrect. However, in this specification, along with a pixel which contributes to display, the term "pixel" is used, including an electrode comprising the same transparent conductive film, and an opening formed in the same light-shielding layer BM as the pixel even without a transparent conductive film.

In the present embodiment, when the length in the first direction X is defined as width, the width of the pixel PPX is substantially equal to that of each pixel PX. The diameter of the opening portion POP is substantially equal to the width of the pixel PPX. In FIG. 4, the diameter of the optical system 2 is equivalent to approximately 5 times the diameter of the opening portion POP. For example, the diameter of the optical system 2 is approximately 3000 μm, and the diameter of the opening portion POP is approximately 600 μm.

Pixels BPX for light shielding are provided so as to be adjacent to the pixel PPX. It should be noted that the number of pixels BPX adjacent to the pixel PPX is not limited to the above description. Alternatively, on the opposite sides of the directions adjacent to the pixel PPX, pixels BPX may be further provided so as to be adjacent to the pixels BPX adjacent to the pixel PPX. In other words, pixels BPX may be provided in a plurality of rows and a plurality of columns.

Each pixel BPX comprises subpixels BSP1 to BSP3. Similarly to the pixels PX, in any pixel BPX, the subpixel BSP1, the subpixel BSP2 and the subpixel BSP3 are arrayed in the same manner.

The subpixels BSP1 to BSP3 constitute the light-shielding layer BM. By this configuration, the light from the optical system 2 is blocked in the subpixels BSP.

Pixels LPX for illumination are provided so as to be adjacent to the pixels BPX. The number of pixels LPX adjacent to the pixels BPX is not limited to the above description. For example, one pixel LPX may be provided for each of the first direction X and the second direction Y. In other words, four pixels LPX may be provided. Alternatively, pixels LPX may be further provided on sides which are not adjacent to the pixels BPX. In other words, pixels LPX may be provided in a plurality of rows and a plurality of columns.

Each pixel LPX comprises subpixels LSP1 to LSP3. Similarly to the pixels PX, in any pixel LPX, the subpixel LSP1, the subpixel LSP2 and the subpixel LSP3 are arrayed in the same manner.

The subpixels LSP1 to LSP3 are configured without a coloring layer. Alternatively, the subpixels LSP1 to LSP3 may comprise a transparent resinous layer (coloring layer CFW) instead of the color filter CF. In any case, the light which passes through the subpixels LSP is white light.

In the present embodiment, the pixels LPX which do not comprise a coloring layer or comprise a transparent resinous layer are provided around the pixel PPX comprising the opening portion POP. In the periphery of the opening portion POP, the pixels LPX emit white illumination light to the object. By this configuration, the illuminance of the object captured by the imaging device 1 is increased. Thus, a clear picture can be taken by the imaging device 1.

Figure 5:
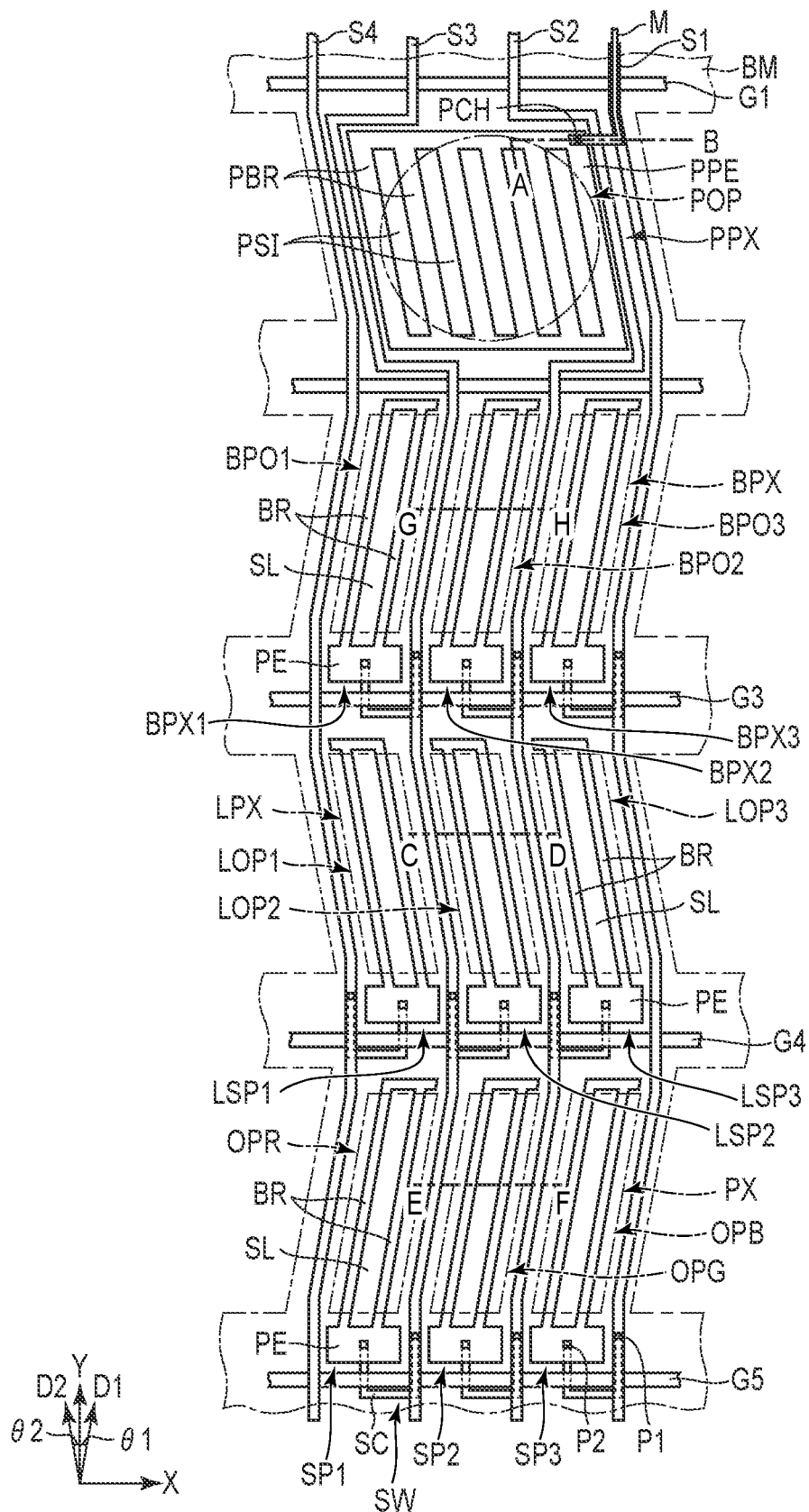
FIG. 5 is an enlarged plan view of the pixel PPX, the pixel BPX, the pixel LPX and the pixel PX shown in FIG. 4.

FIG. 5 is an enlarged plan view of the pixel PPX, the pixel BPX, the pixel LPX and the pixel PX shown in FIG. 4.

As shown in FIG. 5, a direction intersecting with the second direction Y clockwise at an acute angle is defined as a direction D1, and a direction intersecting with the second direction Y counterclockwise at an acute angle is defined as a direction D2. The angle θ1 between the second direction Y and the direction D1 is substantially equal to the angle θ2 between the second direction Y and the direction D2.

Scanning lines G1 to G4 extend in the first direction X and are arranged at intervals in the second direction Y. Signal lines S1 to S4 extend in the second direction Y and are arranged at intervals in the first direction X. Each of the scanning lines G and the signal lines S is formed of a metal material such as aluminum (Al), titanium (Ti), silver (Ag), molybdenum (Mo), tungsten (W), copper (Cu) and chromium (Cr), or an alloy prepared by combining these metal materials.

Each of the scanning lines G and the signal lines S may comprise a single-layer structure or a multilayer structure. The scanning lines G or the signal lines S may not necessarily extend linearly and may be partly curved. For example, even when the signal lines S are partly curved, the signal lines S are assumed to extend in the second direction Y.

The pixel PX is located between the scanning line G4 and a scanning line G5 and between the signal line S1 and the signal line S4. In each subpixel SP, a semiconductor layer SC intersects with the scanning line G twice, and the switching element SW is configured by a thin-film transistor (TFT) comprising a double-gate structure. It should be noted that the switching element SW may be configured by a TFT comprising a single-gate structure in which the semiconductor layer SC intersects with the scanning line G once. The semiconductor layer SC is connected to the signal line S in a connection location P1 and is connected to a pixel electrode PE in a connection location P2. Although a relay electrode is interposed between the pixel electrode PE and the semiconductor layer SC in the connection location P2, the relay electrode is not shown in FIG. 5.

Each pixel electrode PE comprises a plurality of linear electrodes BR, and a slit SL between adjacent linear electrodes BR. In the example shown in the figure, the linear electrodes BR extend in the direction D1. Each pixel electrode PE comprises two linear electrodes BR and a single slit SL. However, the number of linear electrodes BR or slits SL is not limited to this example.

Each subpixel SP is controlled by the signal line S and the scanning line G to which the semiconductor layer SC is connected. For example, the subpixel SP1 is controlled by the scanning line G5 and the signal line S3. The subpixel SP2 is controlled by the scanning line G5 and the signal line S2. The subpixel SP3 is controlled by the scanning line G5 and the signal line S1.

The pixel LPX is located between the scanning line G3 and the scanning line G4 and between the signal line S1 and the signal line S4. The configuration of each subpixel LSP in FIG. 5 is the same as that of the above subpixels SP. It should be noted that, regarding each subpixel LSP, the subpixel LSP1 is controlled by the scanning line G4 and the signal line S3, and the subpixel LSP2 is controlled by the scanning line G4 and the signal line S2, and the subpixel LSP3 is controlled by the scanning line G4 and the signal line S1. The linear electrodes BR and the slit SL of each subpixel LSP extend in the second direction D2.

The pixel BPX is located between the scanning line G2 and the scanning line G3 and between the signal line S1 and the signal line S4. The configuration of each subpixel BSP in FIG. 5 is the same as that of the above subpixels LSP. It should be noted that, regarding each subpixel BSP, the subpixel BSP1 is controlled by the scanning line G3 and the signal line S3, and the subpixel BSP2 is controlled by the scanning line G3 and the signal line S2, and the subpixel BSP3 is controlled by the scanning line G3 and the signal line S1.

Since the pixel BPX is covered with the light-shielding layer BM as shown in FIG. 4, the light from the pixel BPX is blocked, and the pixel BPX does not contribute to display. In other words, even if a signal is input to the pixel BPX from the scanning lines and the signal lines, the pixel BPX displays black.

The pixel BPX may be always in an off-state and display black without an input of a signal, or may be in an on-state. The semiconductor layer SC may not be provided. In other words, the switching element SW may not be provided. The pixel BPX may not be controlled by the scanning lines G or the signal lines S. Even when the switching element SW is not provided, the pixel BPX displays black by the light-shielding layer BM.

The pixel PPX is located between the scanning line G1 and the scanning line G2 and between the signal line S1 and the signal line S4. The pixel PPX comprises a pixel electrode PPE. The pixel electrode PPE comprises a plurality of linear electrodes PBR and slits PSL. In the example shown in the figure, the linear electrodes PBR extend in the direction D2. The pixel electrode PPE comprises six linear electrodes PBR and five slits PSL. However, the number of linear electrodes PBR or slits PSL is not limited to this example.

As seen in plan view, the signal line S2 extends between the pixel electrode PPE and the scanning line G1, between the pixel electrode PPE and the signal line S1 and between the pixel electrode PPE and the scanning line G2. As seen in plan view, the signal line S3 extends between the pixel electrode PPE and the scanning line G1, between the pixel electrode PPE and the signal line S4 and between the pixel electrode PPE and the scanning line G2. The signal lines S2 and S3 extend, bypassing the opening portion POP. In the present embodiment, as seen in plan view, the signal lines S2 and S3 are spaced apart from the pixel electrode PPE.

The metal line M overlaps the signal line S1 and extends along the signal line S1. As seen in plan view, the metal line M intersects with the signal line S2 and is connected to the pixel electrode PPE via a contract hole PCH. The pixel electrode PPE is not connected to the scanning lines G or the signal lines S. The pixel PPX is controlled by the metal line M.

The light-shielding layer BM overlaps the scanning lines G1 to G4, the signal lines S1 to S4 and the semiconductor layer SC of each subpixel LSP and each subpixel SP. The light-shielding layer BM comprises an opening portion LOP1 located in the subpixel LSP1, an opening portion LOP2 located in the subpixel LSP2, a LOP3 located in the subpixel LSP3, an opening portion OPR located in the subpixel SP1, an opening portion OPG located in the subpixel SP2 and an opening portion OPB located in the subpixel SP3.

The light-shielding layer BM covers the subpixels BSP1 to BSP3.

The opening portion POP of the light-shielding layer BM overlaps the pixel electrode PPE.

The coloring layer CFR of the first color shown in FIG. 4 overlaps the opening portion OPR. The coloring layer CFG of the second color overlaps the opening portion OPG. The coloring layer CFB of the third color overlaps the opening portion OPB.

As described above, no coloring layer (color filter CF) is provided in the opening portion LOP1, the opening portion LOP2 or the opening portion LOP3. Alternatively, a transparent resinous layer (coloring layer CFW) is provided in the opening portion LOP1, the opening portion LOP2, and the opening portion LOP3.

Figure 6:
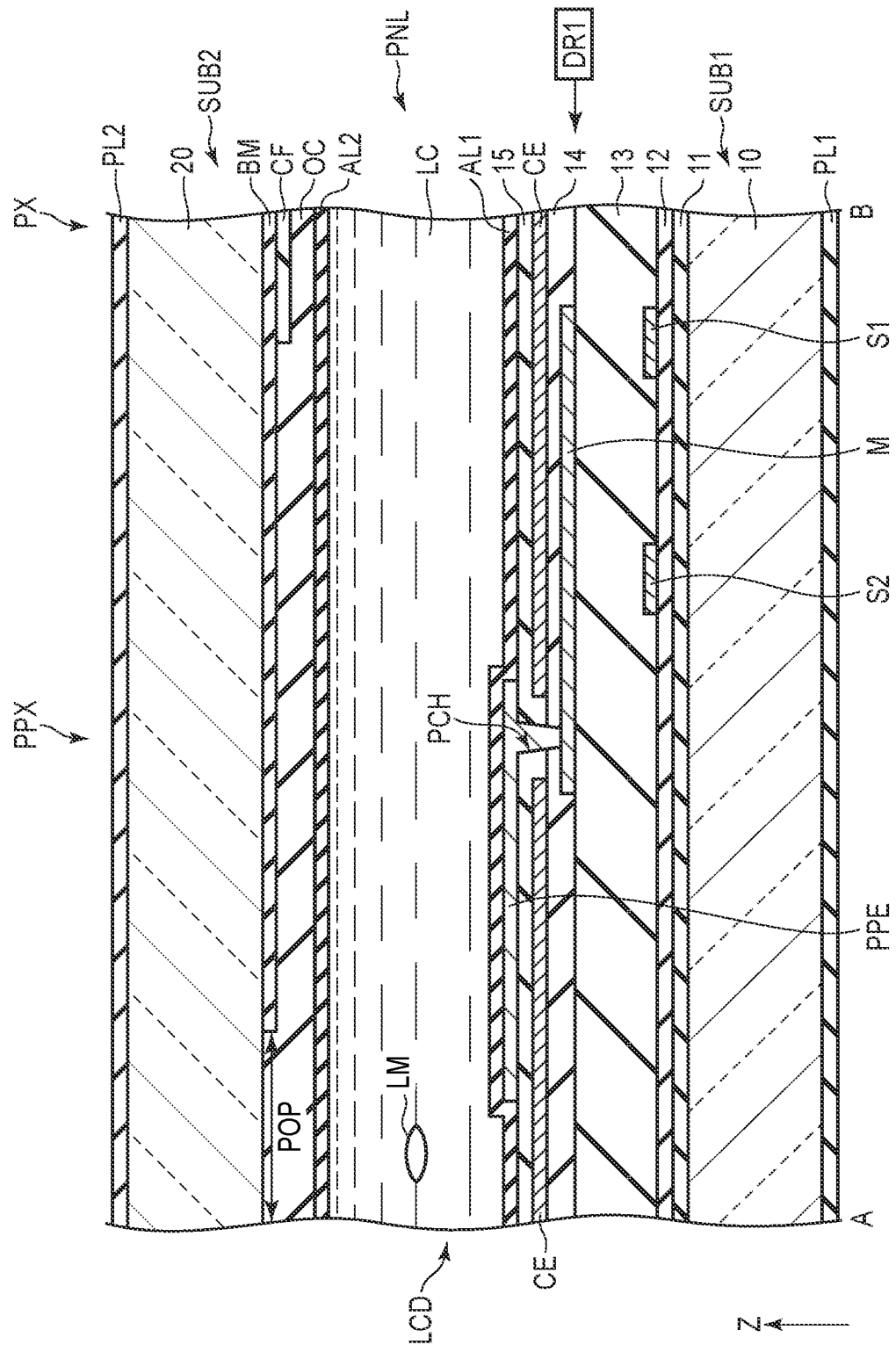
FIG. 6 is a cross-sectional view of a liquid crystal element LCD along the A-B line shown in FIG. 5.

FIG. 6 is a cross-sectional view of the liquid crystal element LCD along the A-B line shown in FIG. 5. Here, this specification explains the liquid crystal element LCD comprising the liquid crystal panel PNL corresponding to a display mode which uses a lateral electric field between the polarizer PL1 and the polarizer PL2.

As shown in FIG. 6, the first substrate SUB1 comprises insulating layers 11 to 15, the signal lines S1 and S2, the common electrode CE, the metal line M and the pixel electrode PPE between the insulating substrate 10 and the alignment film AL1. The insulating layer 11 is located on the insulating substrate 10. The insulating layer 12 is located on the insulating layer 11. For example, the scanning line G and the semiconductor layer SC shown in FIG. 5 are located between the insulating substrate 10 and the insulating layer 11 or between the insulating layer 11 and the insulating layer 12. The signal lines S1 and S2 are located on the insulating layer 12 and are covered with the insulating layer 13.

The metal line M is located on the insulating layer 13 and is covered with the insulating layer 14. The common electrode CE is located on the insulating layer 14 and is covered with the insulating layer 15. The pixel electrode PPE is located on the insulating layer 15 and is covered with the alignment film AL1. The contact hole PCH penetrates the insulating layers 14 and 15. The pixel electrode PPE faces the common electrode CE via the insulating film 15. The common electrode CE and the pixel electrode PPE are transparent electrodes formed of a transparent conductive material such as ITO or IZO.

In the second substrate SUB2, the light-shielding layer BM is located immediately above the metal line M and immediately above the pixel electrode PPE. The color filter CF is located immediately above the signal line S1.

In the pixel PPX, the light-shielding layer BM is in contact with the transparent layer OC. In each pixel BPX, the light-shielding layer BM is in contact with the transparent layer OC. In each pixel LPX, the light-shielding layer BM is in contact with the transparent layer OC, or is in contact with a transparent resinous layer provided in the location of the color filter CF. In each pixel PX, the light-shielding layer BM is in contact with the color filter CF. The insulating substrate 20 is in contact with the transparent layer OC in the opening portion POP. The details of the cross-sectional structures of the pixel PPX, the pixels BPX, the pixels LPX and the pixels PX are explained later.

A drive portion DR1 applies voltage to the metal line M and controls the transmittance in the pixel PPX of the liquid crystal element LCD. The transmittance of the liquid crystal element LCD is controlled based on the voltage applied to the liquid crystal layer LC. The drive portion DR1 is electrically connected to the IC chip 6.

For example, in the pixel PPX, in an off-state in which no voltage is applied to the liquid crystal layer LC via the metal line M, liquid crystal molecules LM contained in the liquid crystal layer LC are initially aligned in a predetermined direction between the alignment films AL1 and AL2. Thus, the pixel PPX has the minimum transmittance and displays black. In other words, the liquid crystal element LCD exerts a light-shielding function in the pixel PPX.

In an on-state in which voltage is applied to the liquid crystal layer LC via the metal line M, the liquid crystal molecules LM are aligned in a direction different from the initial alignment direction by an electric field formed between the pixel electrode PPE and the common electrode CE. The alignment direction is controlled by an electric field. The liquid crystal element LCD displays white or is in a transparent state in the case of the maximum transmittance in the pixel PPX which is in an on-state. In other words, the liquid crystal element LCD exerts a transmissive function in the pixel PPX.

Figure 7A:
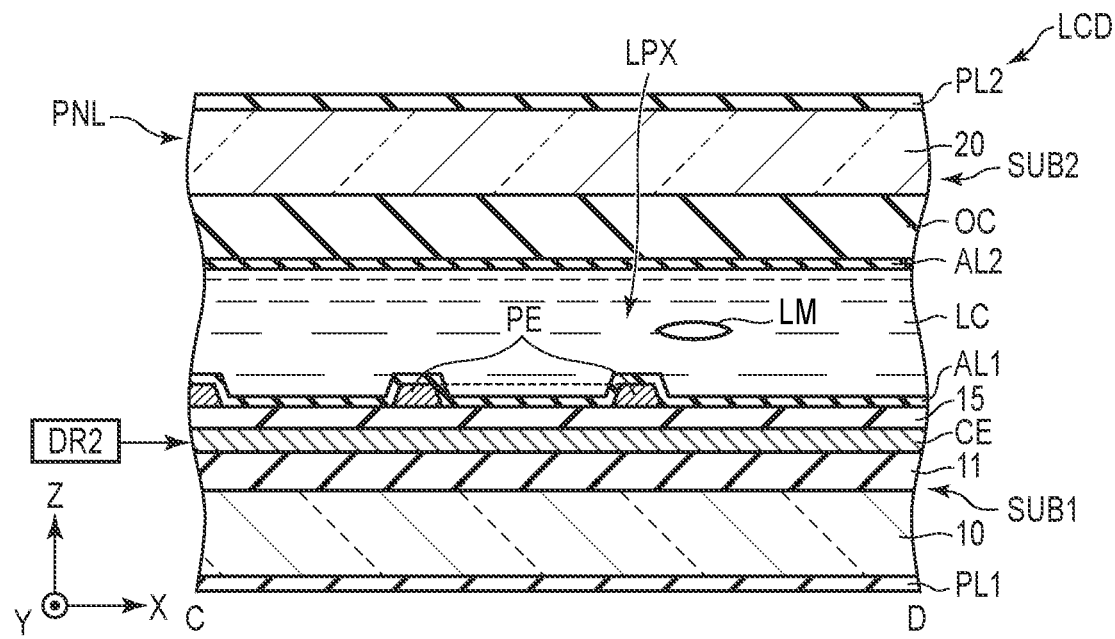
FIG. 7A is a cross-sectional view of the liquid crystal element LCD along the C-D line shown in FIG. 5.
Figure 7B:
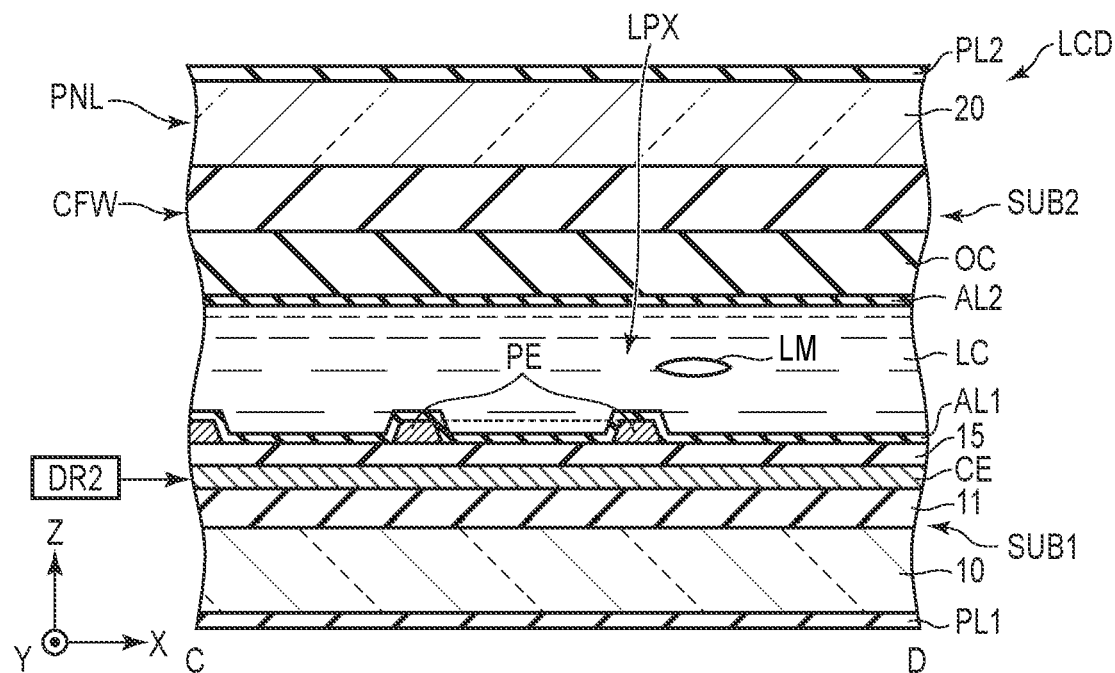
FIG. 7B is a cross-sectional view of the liquid crystal element LCD along the C-D line shown in FIG. 5.
Figure 8:
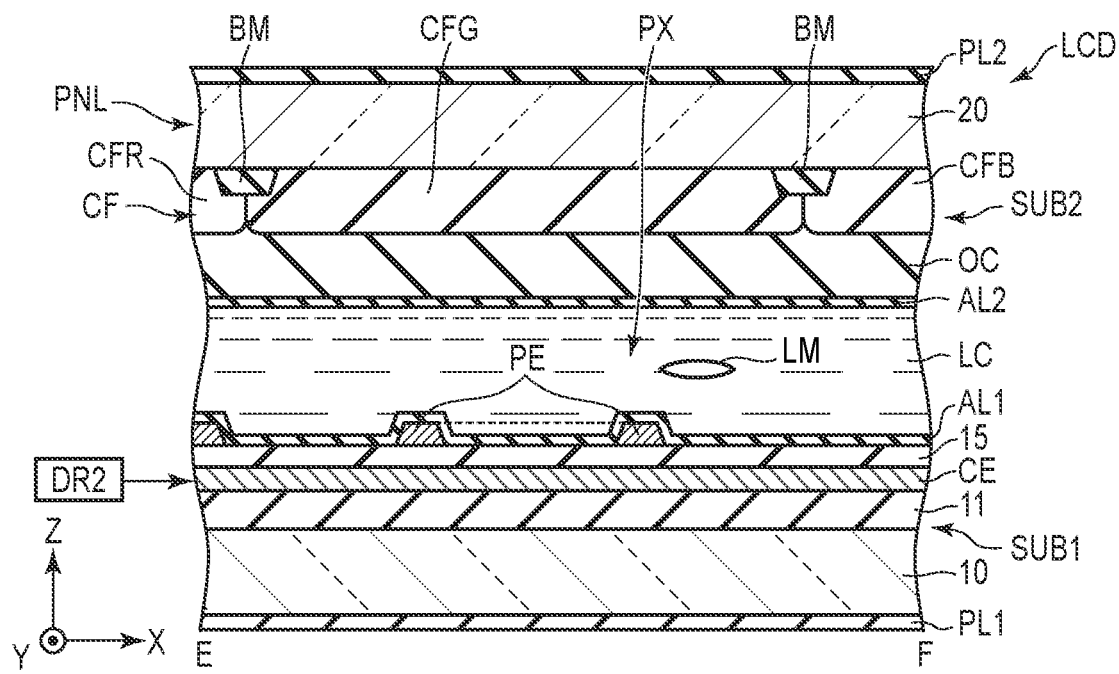
FIG. 8 is a cross-sectional view of the liquid crystal element LCD along the E-F line shown in FIG. 5.
Figure 9:
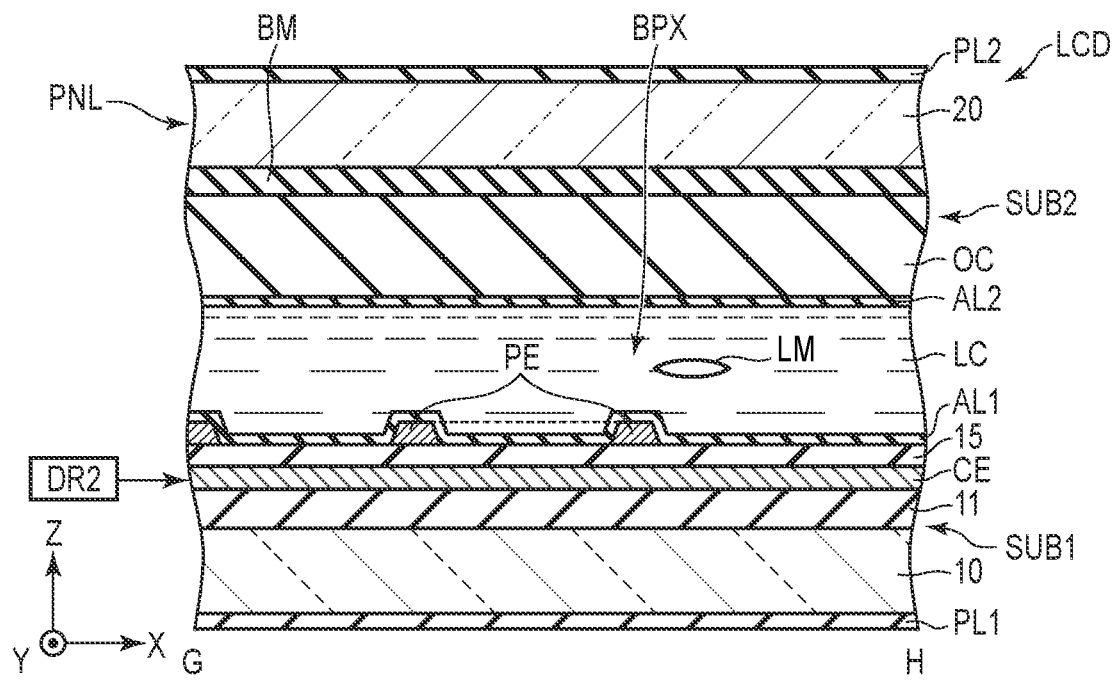
FIG. 9 is a cross-sectional view of the liquid crystal element LCD along the G-H line shown in FIG. 5.

Each of FIG. 7A, FIG. 7B, FIG. 8 and FIG. 9 is a cross-sectional view of the liquid crystal element LCD including the pixel LPX, the pixel PX and the pixel BPX shown in FIG. 5. FIG. 7A and FIG. 7B are cross-sectional views of the liquid crystal element LCD along the C-D line shown in FIG. 5. FIG. 8 is a cross-sectional view of the liquid crystal element LCD along the E-F line shown in FIG. 5. FIG. 9 is a cross-sectional view of the liquid crystal element LCD along the G-H line shown in FIG. 5. The insulating layers 12 to 14 and the signal lines S are omitted in the figures.

As shown in FIG. 7A and FIG. 7B, in the first substrate SUB1, the pixel electrode PE is located on the insulating layer 15 and is covered with the alignment film AL1. The pixel electrode PE is a transparent electrode formed of a transparent conductive material such as ITO or IZO.

As shown in FIG. 7A, no coloring layer is provided in a location facing the pixel electrode PE in the second substrate SUB2 in the pixel LPX. As shown in FIG. 7B, instead of a coloring layer, a coloring layer CFW which is a transparent resinous layer is provided so as to face the pixel electrode PE in the second substrate SUB2.

A drive portion DR2 which drives the liquid crystal element LCD includes, for example, a scanning line drive circuit electrically connected to the scanning lines G shown in FIG. 3, and a signal line drive circuit electrically connected to the signal lines S. The drive portion DR2 outputs signals necessary for the application of irradiation light to each pixel LPX of the display portion DA and controls the transmittance of the liquid crystal element LCD. The drive portion DR2 is electrically connected to the IC chip 6.

In an off-state in which no voltage is applied to the liquid crystal layer LC, the light which was guided from the light sources EM1 shown in FIG. 1 to the pixel LPX is absorbed by the polarizer PL1 and the polarizer PL2. Thus, irradiation light is not applied to the liquid crystal element LCD in the pixel LPX which is in an off-state.

In an on-state in which voltage is applied to the liquid crystal layer LC, the light which was guided to the pixel LPX partly passes through the polarizers PL1 and PL2. Thus, white irradiation light is applied to the liquid crystal element LCD in the pixel LPX which is in an on-state.

As shown in FIG. 8, the coloring layer CFG of the second color is provided so as to face the pixel electrode PE in the second substrate SUB2 in the pixel PX. The coloring layer CFR of the first color and the coloring layer CFB of the third color also face other respective pixel electrodes PE (not shown).

The drive portion DR2 outputs signals necessary for image display to each pixel PX of the display portion DA and controls the transmittance of the liquid crystal element LCD. In an off-state in which no voltage is applied to the liquid crystal layer LC, the light which was guided from the light sources EM1 shown in FIG. 1 to the pixel PX is absorbed by the polarizer PL1 and the polarizer PL2. Thus, the liquid crystal element LCD displays black in the pixel PX which is in an off-state.

In an on-state in which voltage is applied to the liquid crystal layer LC, the light which was guided to the pixel PX partly passes through the polarizers PL1 and PL2. In this way, the liquid crystal element LCD displays a color corresponding to the color filter CF in the pixel PX which is in an on-state.

The above example corresponds to a normally black mode which displays black in an off-state. However, a normally white mode which displays black in an on-state (in other words, which displays white in an off-state) may be applied.

As shown in FIG. 9, the light-shielding layer BM is provided in a location facing the pixel electrode PE in the second substrate SUB2 in the pixel BPX. As the pixel BPX is covered with the light-shielding layer BM in this way, black display is always applied.

The pixel BPX for light shielding displays black whatever signal the input signal is as described above. In other words, even when the same signal as pixels PX is input to the pixel BPX, the pixel BPX displays black. Thus, the pixel BPX may be controlled by the same signal as pixels PX without independently controlling the pixel BPX.

This type of liquid crystal element LCD is configured to function as a pinhole which adjusts the amount of light entering the camera 1 by transmitting light in the pixel PPX and blocking light in the other pixels BPX and pixels PX overlapping the optical system 2. Based on the diameter of the opening portion POP, the effect of the aberration in the optical system 2 can be reduced, and the sharpness can be improved, and furthermore, the depth of focus can be increased. When the distance between the camera 1 and the object is several centimeters, the resolving power of the camera 1 is improved, and a clear picture can be taken at close range relative to the object.

As an example of photographing in which the object is close to the camera 1, a fingerprint can be captured for fingerprint authentication. Moreover, in addition to the camera 1, an infrared camera may be provided to capture a vein.

The electronic device described above comprises the pixels LPX which do not comprise a coloring layer or comprise a transparent resinous layer around the pixel PPX comprising the opening portion POP. From the periphery of the opening portion, white irradiation light is applied to the object via the pixels LPX. By this configuration, the illuminance of the object captured by the imaging device 1 can be increased, and a clear picture can be taken by the imaging device 1.

Configuration Example 1

Now, another configuration example of the present embodiment is explained.

Figure 10:
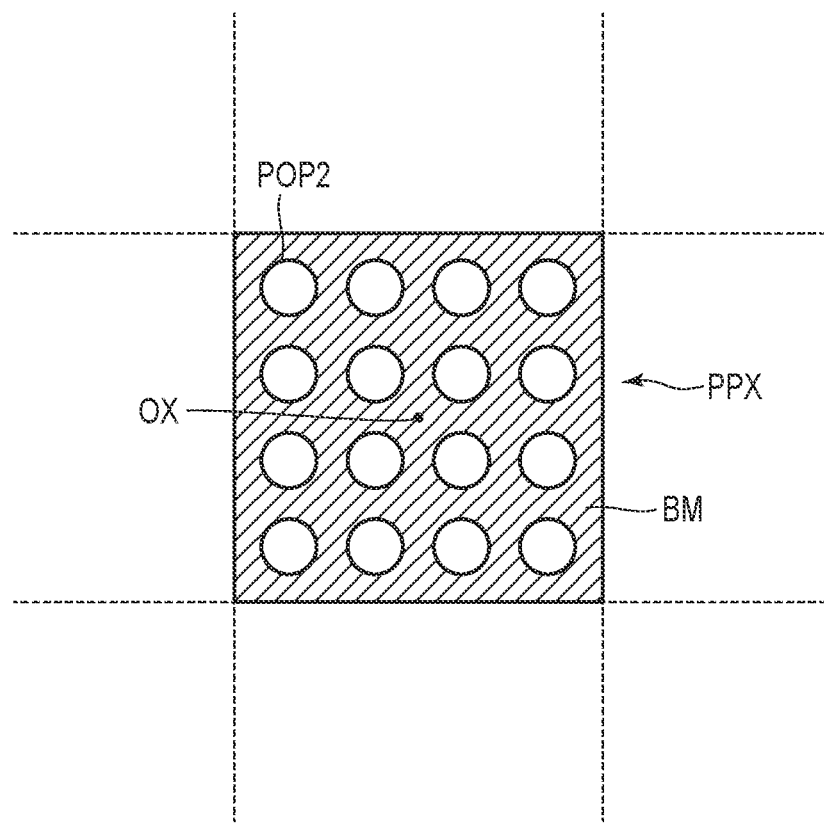
FIG. 10 is a plan view showing another configuration example of an opening portion POP.

FIG. 10 is a plan view showing another configuration example of the opening portion POP in the present embodiment. The configuration example shown in FIG. 10 is different from the configuration example shown in FIG. 4 in respect that a plurality of opening portions POP2 are provided.

As seen in plan view, the pixel PPX shown in FIG. 10 comprises, as the opening portion POP, a plurality of opening portions POP2 evenly provided within the pixel PPX. Each opening portion POP2 is formed roundly. Each opening portion POP2 should be preferably formed in a perfect circle. The diameter of each opening portion POP2 is less than that of the opening portion POP shown in FIG. 4.

Each opening portion POP2 may not necessarily overlap the center OX of the optical system 2. However, each opening portion POP2 should be preferably provided in a location of point symmetry with respect to the center OX.

By providing the opening portions POP2, the amount of light which enters the light-receiving surface of the imaging device 1 is increased, and a clearer picture can be taken.

Effects similar to those of the above embodiment can be obtained from this configuration example.

Configuration Example 2

Figure 11:
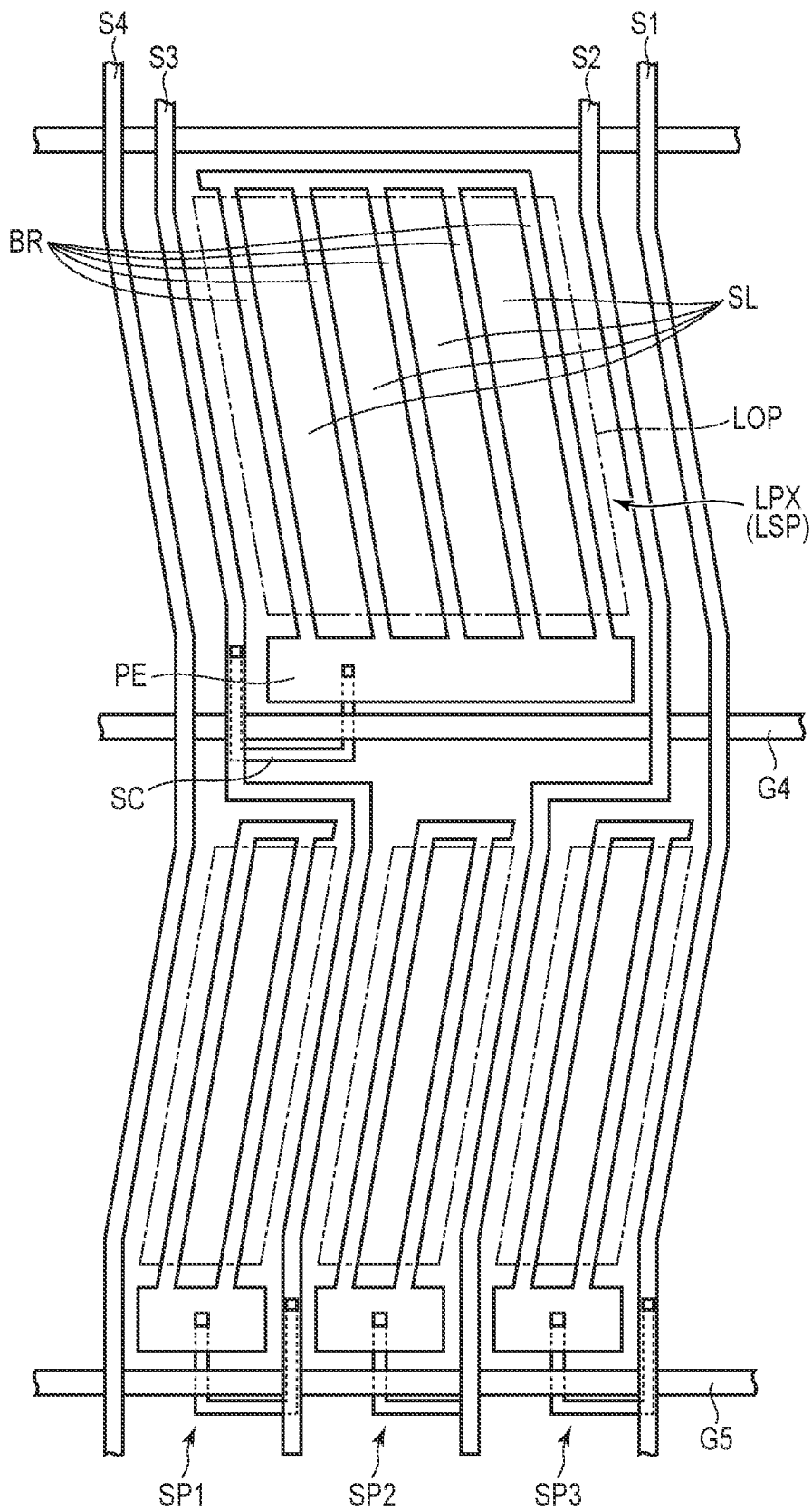
FIG. 11 is a plan view showing another configuration example of a subpixel LSP.

FIG. 11 is a plan view showing another configuration example of the subpixels LSP in the present embodiment. The configuration example shown in FIG. 11 is different from the configuration example shown in FIG. 5 in respect that each subpixel LSP of the pixel LPX is larger than each subpixel SP of the pixel PX.

The pixel LPX shown in FIG. 11 comprises a single subpixel LSP. The pixel LPX is located between the scanning line G3 and the scanning line G4 and between the signal line S1 and the signal line S4. The pixel LPX (subpixel LSP) is controlled by the scanning line G4 and the signal line S3.

The pixel LPX shown in FIG. 11 comprises five linear electrodes BR and four slits SL. However, the number of linear electrodes BR or slits SL is not limited to this example.

For example, the width of the pixel LPX (subpixel LSP) shown in FIG. 11 in the first direction X is approximately 2.5 times that of each subpixel SP of the pixel PX. The size of an opening portion LOP is also approximately 2.5 times that of an opening portion OP.

In the example of FIG. 11, the pixel LPX is long in the first direction X. However, the pixel LPX may be long in the second direction Y. Further, the pixel LPX may be long in both the first direction X and the second direction Y.

Figure 12:
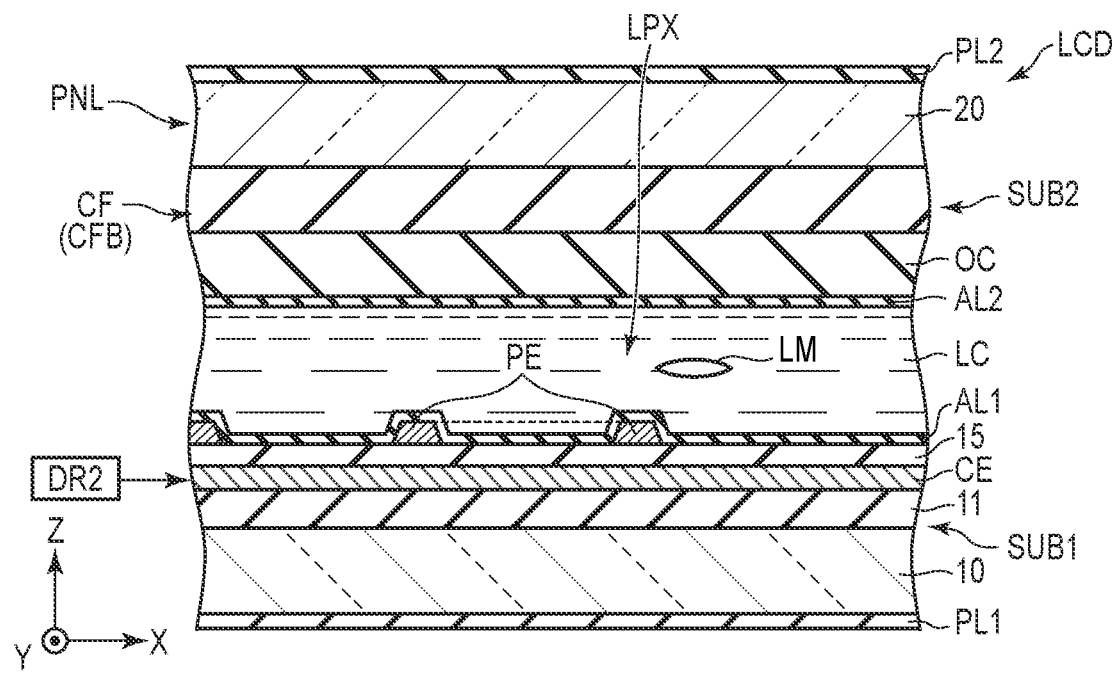
FIG. 12 is a cross-sectional view of a pixel LPX.

In this configuration example, the irradiation light applied to the object from the pixel LPX may be monochromatic light. FIG. 12 is a cross-sectional view of the pixel LPX.

The pixel LPX shown in FIG. 12 comprises a monochromatic coloring layer, for example, a blue coloring layer CFB as the color filter CF. In this case, the irradiation light applied from the pixel LPX to the object is blue light. It should be noted that the color of the coloring layer is not limited to blue. Another color, for example, red or green may be selected depending on the sensitivity of the imaging device 1.

Effects similar to those of the above embodiment can be obtained from this configuration example.

Configuration Example 3

Figure 13:
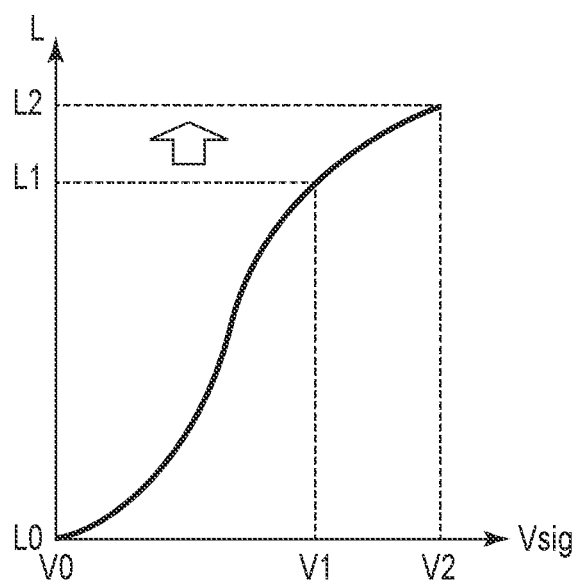
FIG. 13 is a diagram showing the relationship of luminance relative to the applied voltage in a pixel LPX and a pixel PX.

FIG. 13 is a diagram showing the relationship of luminance relative to the applied voltage in the pixel LPX and the pixel PX in the present embodiment. The configuration example shown in FIG. 13 is different from the configuration example shown in FIG. 3 in respect that the voltage applied to the pixel LPX is greater than the voltage applied to the pixel PX.

In this configuration example, the voltage applied to the pixel LPX and the voltage applied to the pixel PX are voltage Vsig applied to the signal line S of the pixel LPX and the signal line S of the pixel PX, respectively, in other words, an image signal. When voltage Vsig is voltage V0, the pixel PX is in an off-state (luminance L0), in other words, displays black. When voltage Vsig is voltage V1 which is the maximum voltage, the pixel PX displays luminance L1 relative to the maximum transmittance, in other words, displays white. In other words, the liquid crystal element LCD of this configuration example is driven in a normally black mode.

When voltage V2 which is greater than voltage V1 applied to the pixel PX is applied to the pixel LPX, luminance L2 which is greater than luminance L1 of the pixel PX can be obtained. By this configuration, the illuminance of the object captured by the imaging device 1 can be further increased.

Even if voltage V2 is applied to the pixel PX, the gradation exceeds gradation which can be displayed. However, as the pixel LPX is used for illumination and does not contribute to display, voltage V2 which exceeds the maximum display gradation can be applied. By this configuration, more bright illumination light can be obtained.

Effects similar to those of the above embodiment can be obtained from this configuration example.

Configuration Example 4

Figure 14A:
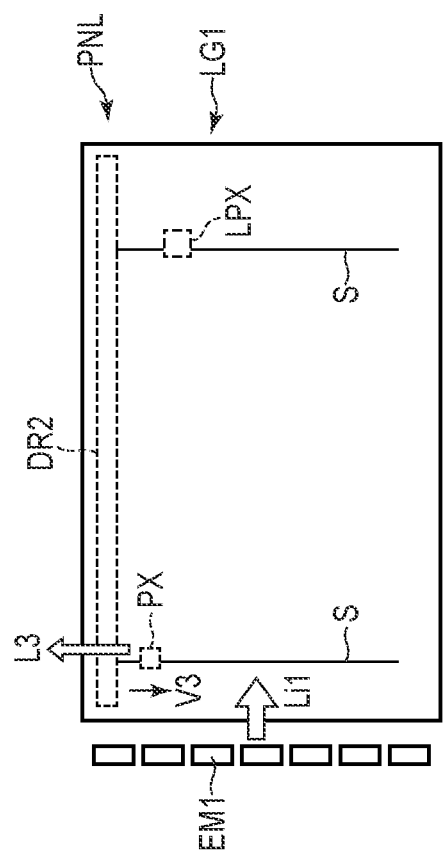
FIG. 14A is a diagram showing another configuration example of the liquid crystal panel PNL.
Figure 14B:
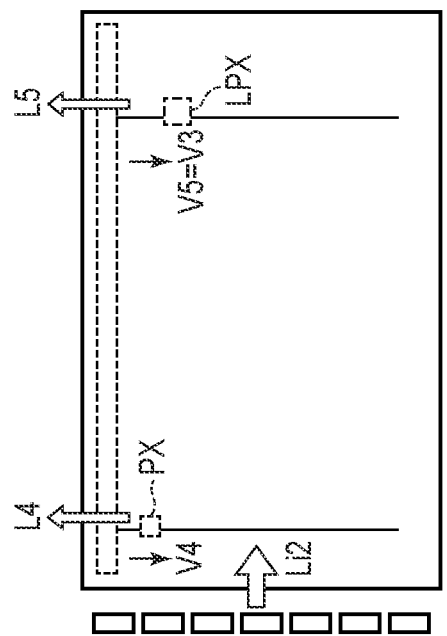
FIG. 14B is a diagram showing another configuration example of the liquid crystal panel PNL.

FIG. 14A and FIG. 14B are diagrams showing another configuration example of the liquid crystal panel PNL of the present embodiment. The configuration example shown in FIG. 14A and FIG. 14B are different from the configuration example shown in FIG. 3 in respect that the luminance of the irradiation light of the light sources EM1 is increased, and the voltage applied to the pixels PX is made less than the pixels LPX in an object capture period.

FIG. 14A and FIG. 14B show the configuration of the liquid crystal panel PNL in an object non-capture period (only display) and an object capture period, respectively. As shown in FIG. 14A, irradiation light having luminance Li1 enters the light guide LG1 of the liquid crystal panel PNL from the light sources EM1. The pixels PX performs image display by modulating incident light and emitting light having luminance L3 based on voltage V3 applied from the drive portion DR2 via the signal line S.

In FIG. 14A, no voltage is applied to the pixels LPX from the drive portion DR2, and the pixels LPX are in an off-state.

As shown in FIG. 14B, irradiation light having luminance Li2 enters the light guide LG1 of the liquid crystal panel PNL from the light sources EM1. At this time, luminance Li2 is greater than luminance Li1 of a non-capture period.

The drive portion DR2 applies voltage V4 to the pixels PX and applies voltage V5 to the pixels LPX via the signal lines S. At this time, voltage V4 is less than voltage V3. Voltage V5 is equal to voltage V3 which is applied to the pixels PX in a non-capture period. The pixels PX perform image display by modulating incident light based on voltage V4 and emitting light having luminance L4. The pixels LPX modulate incident light based on voltage V5 (=voltage V3) and emit light having luminance L5. Since voltage V4 is less than voltage V5, luminance L4 is less than luminance L5. In other words, the luminance of the irradiation light applied to the object via the pixels LPX in a capture period is greater than that of an image displayed by the pixels PX.

However, the configuration in which the luminance of the image displayed in a non-capture period and a capture period is changed is not preferable. For this reason, the drive portion DR2 determines voltage V4 such that luminance L3 of an object non-capture period is equal to luminance L4 of an object capture period in the pixels PX.

In this configuration example, the pixels LPX are caused to be in an off-state in an object non-capture period. However, the configuration is not limited to this example. Even in a non-capture period, in a manner similar to that of the pixels PX, voltage V3 may be applied such that the pixels LPX are in an on-state.

For example, when the pixels LPX are pixels comprising a coloring layer (color filter CF), in a manner similar to that of the pixels PX, an image can be displayed, using the pixels LPX.

Effects similar to those of the above embodiment can be obtained from this configuration example.

Configuration Example 5

Figure 15:
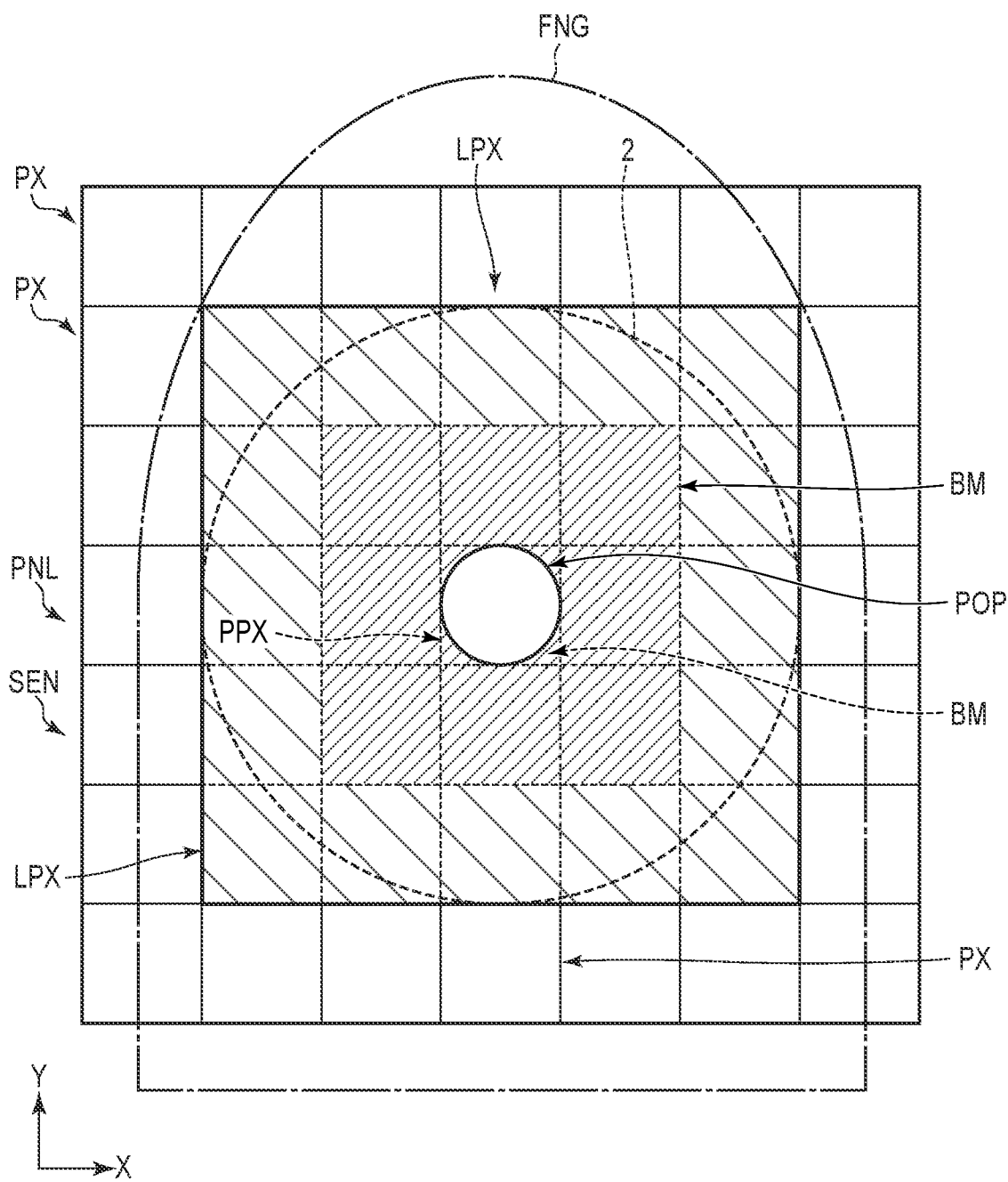
FIG. 15 is a diagram showing another configuration example of the liquid crystal panel PNL.

FIG. 15 is a diagram showing another configuration example of the liquid crystal panel PNL of the present embodiment. The configuration example shown in FIG. 15 is different from the configuration examples shown in FIG. 13, FIG. 14A and FIG. 14B in respect that the liquid crystal panel PNL comprises a sensor which detects the approach or contact of an object, and only when an object approaches or contacts the sensor, the luminance of the pixels LPX is increased.

FIG. 15 shows the configuration of the liquid crystal panel PNL comprising a sensor SEN which detects the approach or contact of an object. The sensor SEN is, for example, a capacitive touch sensor, an optical touch sensor or an electromagnetic induction touch sensor. The sensor SEN may be provided inside the liquid crystal panel PNL, or may be a sensor which is provided outside the liquid crystal panel PNL and overlaps the pixels PX, the pixels LPX and the pixel PPX.

When the sensor SEN detects the approach or contact of an object FNG, as described above, the drive portion DR2 applies voltage Vsig such that the luminance of the pixels LPX is greater than that of the pixels PX.

When the sensor SEN does not detect the approach or contact of the object FNG, the pixels LPX are driven in the same manner as FIG. 14A. The drive portion DR2 does not apply voltage to the pixels LPX such that the pixels LPX are in an off-state. Alternatively, the drive portion DR2 applies the same voltage as the pixels PX to the pixels LPX such that normal display is performed.

By providing the sensor SEN, only when the object FNG approaches or contacts the sensor SEN, the pixels LPX can emit illumination light having a high luminance. In other words, in image display in a state in which the object FNG does not approach or contact the sensor SEN, the pixels LPX do not emit illumination light having a high luminance. In this way, the visibility of the liquid crystal panel PNL is further improved.

In this configuration example, instead of the imaging device 1, a photoreceiver such as a photoelectric conversion element may be provided. Even when a photoreceiver is provided, the luminance of the pixels LPX is great. Thus, the sensitivity of the photoreceiver is increased.

Configuration Example 6

FIG. 16 is a diagram showing another configuration example of the pixels LPX of the present embodiment. The configuration example shown in FIG. 16 is different from the configuration example shown in FIG. 5 in respect that a plurality of pixels LPX are driven by the same signal line and the same scanning line.

The signal line S shown in FIG. 16 comprises a circular signal line SL1 and a linear signal line SL2. The signal line SL1 is provided concentrically with the opening portion POP as seen in plan view. The scanning line G shown in FIG. 16 comprises a circular scanning line GL1 and a linear scanning line GL2. The scanning line GL1 is provided concentrically with the opening portion POP as seen in plan view. Thus, the scanning line GL1 is provided concentrically with the signal line SL1. None of the scanning lines GL1 and GL2 and the signal lines SL1 and SL2 is connected to the other scanning lines G or the other signal lines S. The scanning lines GL1 and GL2 and the signal lines SL1 and SL1 are independently driven by the drive portion DR2.

Each of the pixels LPX is provided concentrically with the opening portion POP. The signal line SL1 and the scanning line GL1 are electrically connected to the pixels LPX. By this configuration, the pixels LPX can be simultaneously driven.

The scanning line G, the signal line S and the pixels LPX shown in FIG. 16 are provided in a circular shape. However, the shape is not limited to this example. For example, they may be provided in a rectangular shape.

A plurality of pixels LPX may be further provided on the opposite side of the pixel PPX so as to be adjacent to the pixels LPX provided concentrically with the opening portion POP. The pixels LPX which are further provided are driven by a different signal line S and a different scanning line G from the signal line SL1 and the scanning line GL1. In other words, a plurality of pixels LPX may be provided concentrically with the opening portion POP in the shape of two or more circles.

Effects similar to those of the above embodiment can be obtained from this configuration example.

Configuration Example 7

Figure 17:
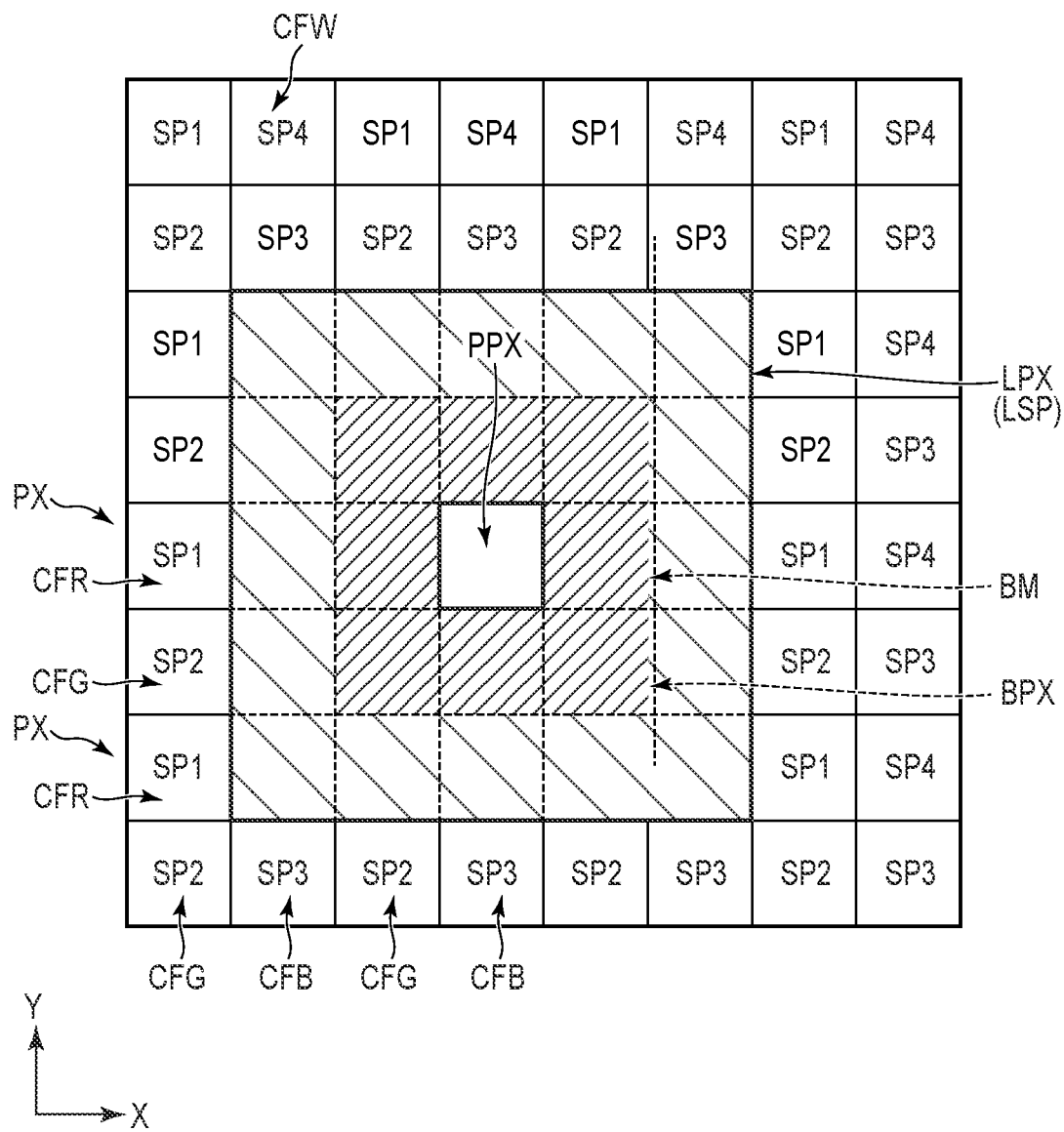
FIG. 17 is a plan view showing another configuration example of a pixel layout.

FIG. 17 is a plan view showing another configuration example of a pixel layout in the present embodiment.

The configuration example shown in FIG. 17 is different from the configuration example shown in FIG. 4 in respect that a subpixel SP4 comprising a coloring layer CFW which is a transparent resinous layer is provided.

In the configuration example shown in FIG. 17, in the first direction X, the subpixels SP1 and SP4 are repeatedly arranged, and at the same time, the subpixels SP2 and the subpixels SP3 are repeatedly arranged. In the second direction Y, the subpixels SP1 and SP2 are repeatedly arranged, and at the same time, the subpixels SP3 and SP4 are repeatedly arranged. The subpixels SP1 to SP4 are arranged such that the subpixels of the same type are not successively arranged in the first direction X or the second direction Y.

In the configuration example shown in FIG. 17, in the pixel PX in which the pixel PPX is located, the pixel PX is formed without a subpixel SP4. The pixel PPX occupies, of the pixel PX, the area in which a subpixel SP4 is originally provided. In other words, the pixel PPX occupies the area of a single subpixel SP1.

Pixels BPX for light shielding are provided so as to be adjacent to the pixel PPX. In this configuration example, each pixel BPX occupies the area of a single subpixel SP. Thus, each pixel BPX is also referred to as a subpixel BSP. The pixels BPX are covered with the light-shielding layer BM in a manner similar to that of the above descriptions.

Pixels BPX may be further provided on the opposite side of the direction adjacent to the pixel PPX so as to be adjacent to the pixels BPX adjacent to the pixel PPX. In other words, pixels BPX (subpixels BSP) may be provided in a plurality of rows and a plurality of columns.

Pixels LPX for illumination are provided so as to be adjacent to the pixels BPX. In this configuration example, each pixel LPX occupies the area of a single subpixel SP. Thus, each pixel LPX is also referred to as a subpixel LSP. In each pixel LPX, in the same manner as the above explanation, no color filter CF is provided, or a transparent resinous layer (coloring layer CFW) is provided.

Pixels LPX may be further provided on the opposite side of the direction adjacent to the pixels BPX so as to be adjacent to the pixels LPX adjacent to the pixels BPX. In other words, pixels LPX (subpixels LSP) may be provided in a plurality of rows and a plurality of columns.

Figure 18:
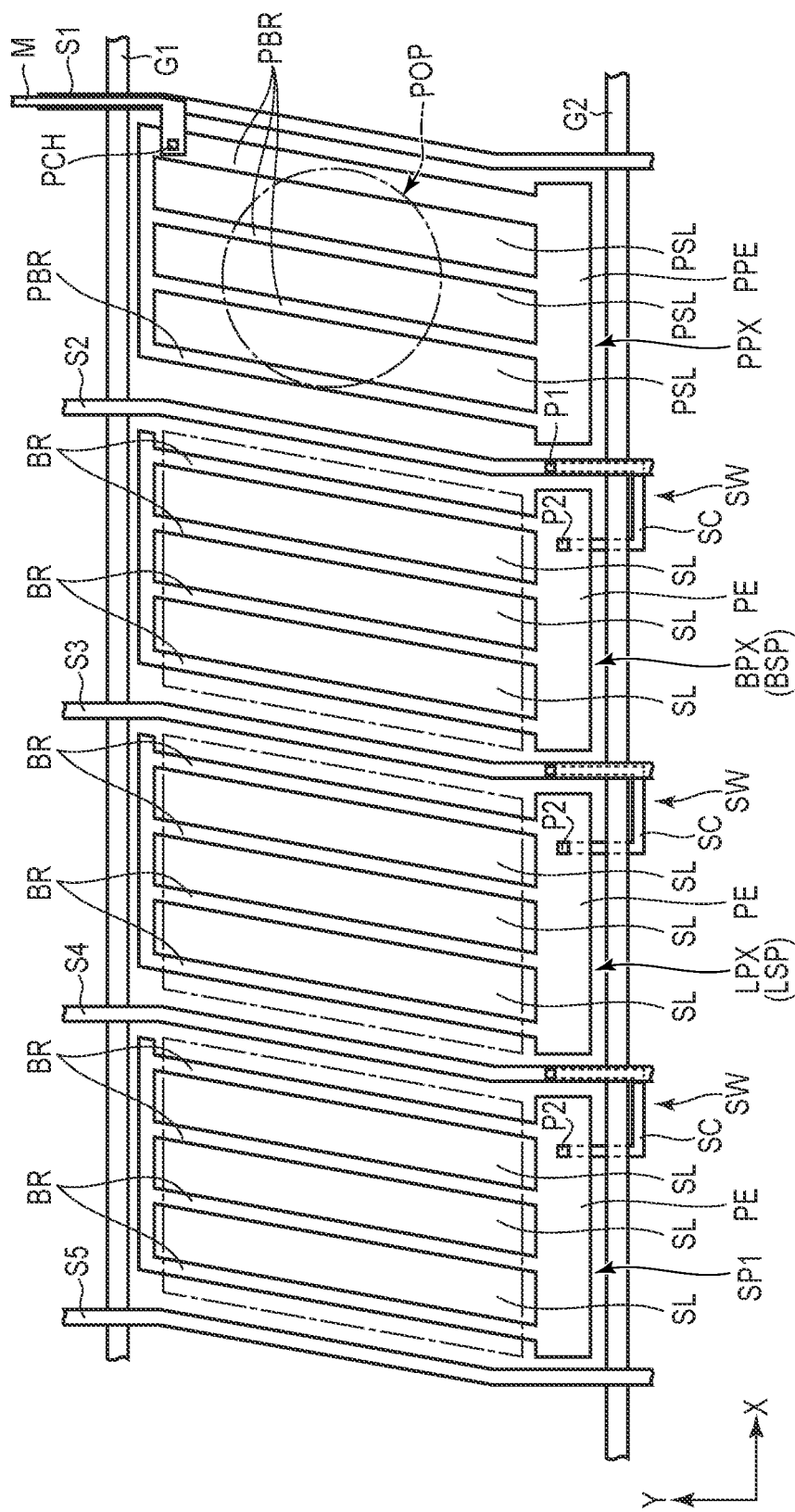
FIG. 18 is a plan view showing the pixel PPX, the pixel BPX, the pixel LPX and the subpixel SP1 shown in FIG. 17.

FIG. 18 is a plan view showing the pixel PPX, the pixel BPX, the pixel LPX and the subpixel SP1 shown in FIG. 17.

As shown in FIG. 17, the pixel electrode PE of the pixel BPX is located between a signal line S2 and a signal line S3. The pixel electrode PE of the pixel LPX is located between the signal line S3 and a signal line S4. The pixel electrode PE of the subpixel SP1 is located between the signal line S4 and a signal line S5. The pixel electrodes PE of the pixel BPX, the pixel LPX and the subpixel SP1 are located between a scanning line G1 and a scanning line G2. The pixel electrode PPE is located between a signal line S1 and the signal line S2 and between the scanning line G1 and the scanning line G2.

In the example shown in the figure, each pixel electrode PE1 comprises four linear electrodes BR and three slits SL, and the pixel electrode PPE comprises four linear electrodes PBR and three slits PSL.

Effects similar to those of the above embodiment can be obtained from this configuration example.

Configuration Example 8

Figure 19:
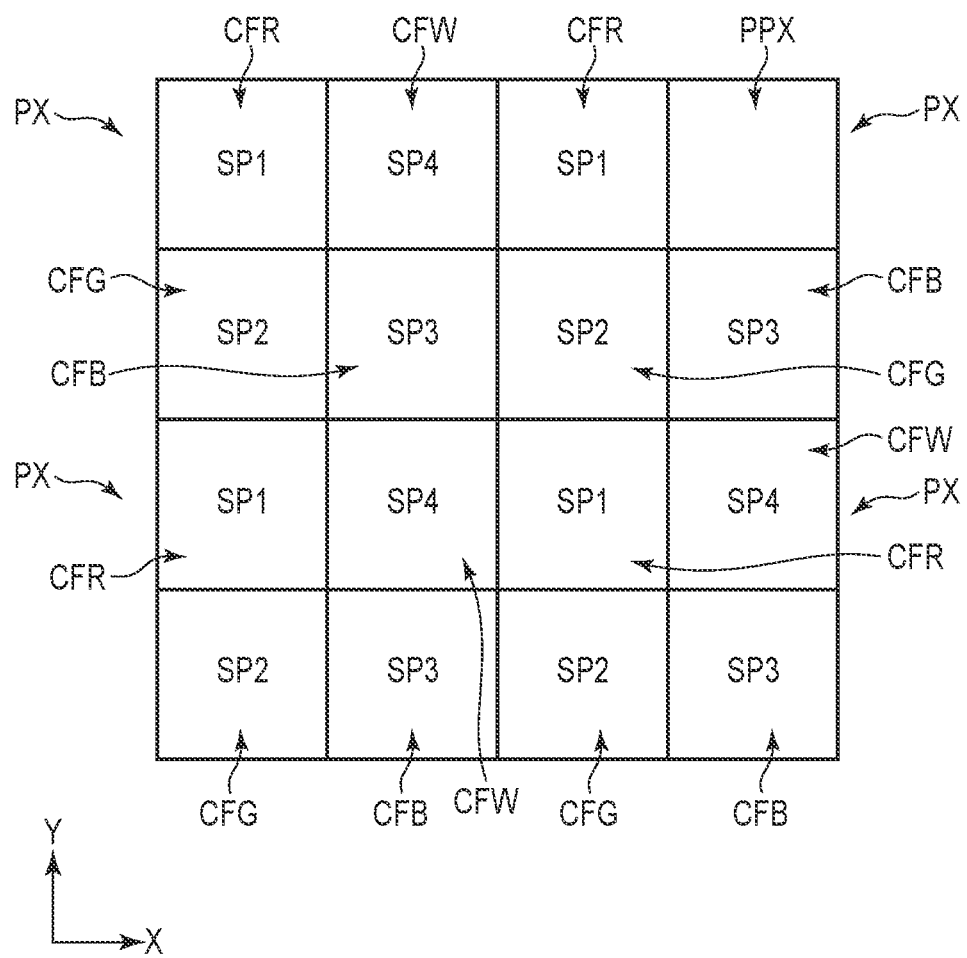
FIG. 19 is a plan view showing another configuration example of a pixel layout in the present embodiment.

FIG. 19 is a plan view showing another configuration example of a pixel layout in the present embodiment.

The configuration example shown in FIG. 19 is different from the configuration example shown in FIG. 17 in respect that the pixels LPX for illumination are not provided.

As shown in FIG. 19, pixels PX (subpixels SP) are provided so as to be adjacent to the pixel PPX. In this configuration example, the illuminance of the object captured by the imaging device 1 can be further increased by the light emitted from the subpixels SP around the pixel PPX.

In this configuration example, pixels BPX (subpixels BSP) for light shielding may be provided between the pixel PPX and the pixels PX.

Effects similar to those of the above embodiment can be obtained from this configuration example.

Embodiment 2

Figure 20:
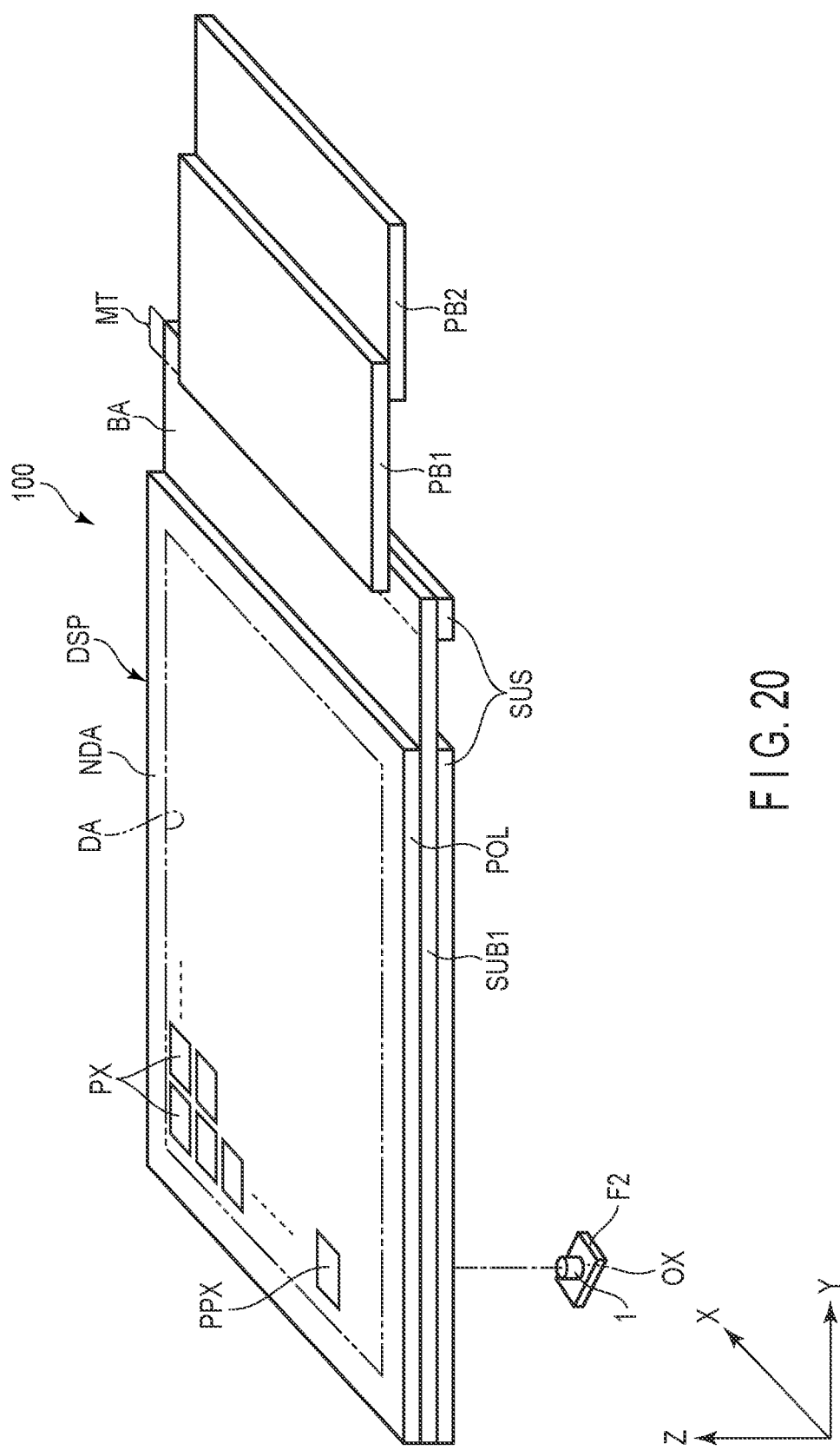
FIG. 20 is a perspective view showing the configuration of an electronic device 100 according to embodiment 2.

FIG. 20 is a perspective view showing the configuration of an electronic device 100 according to the present embodiment. In the present embodiment, a case where a display device is an electroluminescent (EL) display device is explained.

The electronic device 100 comprises an imaging device 1, a display panel DSP, a wiring board PB1, a wiring board PB2 and a support member SUS. The display panel DSP comprises a first substrate SUB1 having a flat-plate shape, and a polarizer POL having a flat-plate shape and provided so as to face the first substrate SUB1. In the present embodiment, the display panel DSP is an organic EL panel.

The display panel DSP comprises a display portion DA which displays an image, and a non-display portion NDA which surrounds the display portion DA. The display panel DSP comprises a pixel PPX and a plurality of pixels PX in the display portion DA. The pixels PX are arranged in a first direction X and a second direction Y and are provided in matrix. The pixel PPX overlaps the center OX of the optical system 2 of the imaging device 1 in a manner similar to that of FIG. 1.

The first substrate SUB1 comprises a pad area MT located on an external side relative to the area overlapping the polarizer POL.

The wiring board PB1 is mounted above the pad area MT in the non-display portion NDA. In the example shown in the figure, the length of the side edges of the wiring board PB1 in the first direction X is less than the length of the side edges of the first substrate SUB1 and the polarizer POL in the first direction X. However, they may be equal to each other. The display panel DSP and the wiring board PB1 are electrically connected to each other. The wiring board PB2 is provided under the wiring board PB1. The wiring board PB1 and the wiring board PB2 are, for example, flexible substrates having flexibility. Although FIG. 20 shows two wiring boards PB1 and PB2, the number of wiring boards may be only one.

The electronic device 100 shown in FIG. 20 comprises a bending area BA which is an area bent when the electronic device 100 is accommodated in a housing.

The support member SUS is located under the display panel DSP and is attached to the first substrate SUB1. The support member SUS is not provided in a location overlapping the bending area BA in a third direction Z. When the electronic device 100 does not need to be bent, the bending area BA or the support member SUS may not be provided.

The wiring boards PB1 and PB2 may be rigid flexible boards comprising a rigid portion formed of a rigid material and a flexible portion. The two wiring boards PB1 and PB2 may not be provided, and a single wiring board may be provided.

FIG. 21 is a plan view showing the circuit configuration of the display panel DSP.

As shown in FIG. 21, the display panel DSP comprises a first insulating substrate 110, a plurality of organic EL elements OLED provided on the first insulating substrate 110, various types of lines, gate drivers GD1 and GD2 and a select circuit SD.

The organic EL elements OLED are arrayed in matrix in the display portion DA. In the present embodiment, the organic EL elements OLED include an organic EL element OLED1 which exhibits a first color, an organic EL element OLED2 which exhibits a second color, an organic EL element OLED3 which exhibits a third color and an organic EL element OLED4 which exhibits a fourth color. Here, the first color is red. The second color is green. The third color is blue. The fourth color is white.

Each organic EL element OLED includes an emitting element, and a pixel circuit which supplies drive current to an organic emitting layer to drive the organic emitting layer. The pixel circuit described above includes, as described later, a drive transistor, various types of switching elements, etc.

The various types of lines described above extend in the display portion DA and extend to the non-display portion NDA. FIG. 21 exemplarily shows, as part of the various types of lines, a plurality of control lines SSG and a plurality of image signal lines VL. The gate drivers GD1 and GD2 and the select circuit SD are located in the non-display portion NDA. In the display portion DA, the control lines SSG and the image signal lines VL are electrically connected to the organic EL elements OLED. The control lines SSG are electrically connected to the gate drivers GD1 and GD2 in the non-display portion NDA. The image signal lines VL are electrically connected to the select circuit SD in the non-display portion NDA.

Various types of signals and voltages are applied to the gate drivers GD1 and GD2 and the select circuit SD from a panel driver PDV.

Now, the circuit configuration of the display panel DSP is explained with reference to FIG. 22. The organic EL elements OLED described above are configured in the same manner. Therefore, in FIG. 22, one of the organic EL elements OLED is explained as a representative.

As shown in FIG. 22, the organic EL element OLED comprises an emitting element ELM, and a pixel circuit PC which supplies drive current to the emitting element ELM. The pixel circuit PC is electrically connected to the pixel electrode PE described later. The pixel circuit PC includes, as a plurality of elements, a drive transistor DRT, a pixel transistor SST, an output transistor BCT, storage capacitance Cs and auxiliary capacitance Cad. The output transistor BCT may be shared by a plurality of organic EL elements OLED as described later.

In FIG. 22, a single output transistor BCT is provided for the organic EL element OLED. The gate driver GD1 includes a reset transistor RST. In FIG. 22, each transistor is an N-ch TFT. The element capacitance Cled shown in FIG. 22 is the internal capacitance of the emitting element ELM, and the capacitance between an anode and a cathode.

It should be noted that each of the reset transistor RST, the pixel transistor SST and the output transistor BCT may not be configured by a transistor. The reset transistor RST, the pixel transistor SST and the output transistor BCT may at least function as a reset switch, a pixel switch and an output switch, respectively.

In the following explanation, one of the source electrode and the drain electrode of each transistor is defined as a first electrode, and the other one is defined as a second electrode. One electrode of each capacitive element is defined as a first electrode, and the other electrode is defined as a second electrode.

The drive transistor DRT, the pixel electrode PE and the emitting element ELM are connected in series between a first power line VDDL and a second power line VSSL. The first power line VDDL is retained at constant potential. The second power line VSSL is retained at constant potential different from the potential of the first power line VDDL. In the present embodiment, potential PVDD of the first power line VDDL is greater than potential PVSS of the second power line VSSL.

The first electrode of the drive transistor DRT is electrically connected to the anode of the emitting element ELM, the storage capacitance Cs and the auxiliary capacitance Cad. The drive transistor DRT is configured to control the current supplied to the emitting element ELM. The second electrode of the drive transistor DRT is electrically connected to the first electrode of the output transistor BCT.

The first electrode of the pixel transistor SST is electrically connected to the gate electrode of the drive transistor DRT and the second electrode of the storage capacitance Cs. The second electrode of the pixel transistor SST is electrically connected to an image signal line VL.

The second electrode of the output transistor BCT is electrically connected to the first power line VDDL. The cathode of the emitting element is electrically connected to the second power line VSSL.

The reset transistor RST is provided in the gate driver GD1. The first electrode of the reset transistor RST is electrically connected to a reset line SV. The second electrode of the reset transistor RST is electrically connected to a reset power line RL.

Voltage Vsig which is an image signal is applied to the image signal line VL. The reset power line RL is set to reset power potential Vrst. Voltage Vsig is a signal written to the organic EL element OLED.

The gate electrode of the output transistor BCT is electrically connected to a control line SBG. An output control signal BG is supplied to the control line SBG.

The gate electrode of the pixel transistor SST is electrically connected to a control line SSG. A pixel control signal SG is supplied to the control line SSG.

The gate electrode of the reset transistor RST is electrically connected to a control line SRG. A reset control signal RG is supplied to the control line SRG.

FIG. 22 is explained, assuming that all of the above transistors are N-ch TFTs. However, for example, the transistors other than the drive transistor DRT may be P-ch TFTs, and both N-ch TFTs and P-ch TFTs may be employed.

The drive transistor DRT may be a P-ch TFT. In this case, current should be caused to flow in the emitting element ELM in the opposite direction of the present embodiment. In any case, the auxiliary capacitance Cad should be at least connected to, of the electrodes of the emitting element ELM, the first electrode on the drive transistor DRT side.

The circuit configuration explained in FIG. 22 is merely an example. Other configurations may be employed. For example, the circuit configuration explained in FIG. 22 may be partly omitted, or other configurations may be added.

Figure 23:
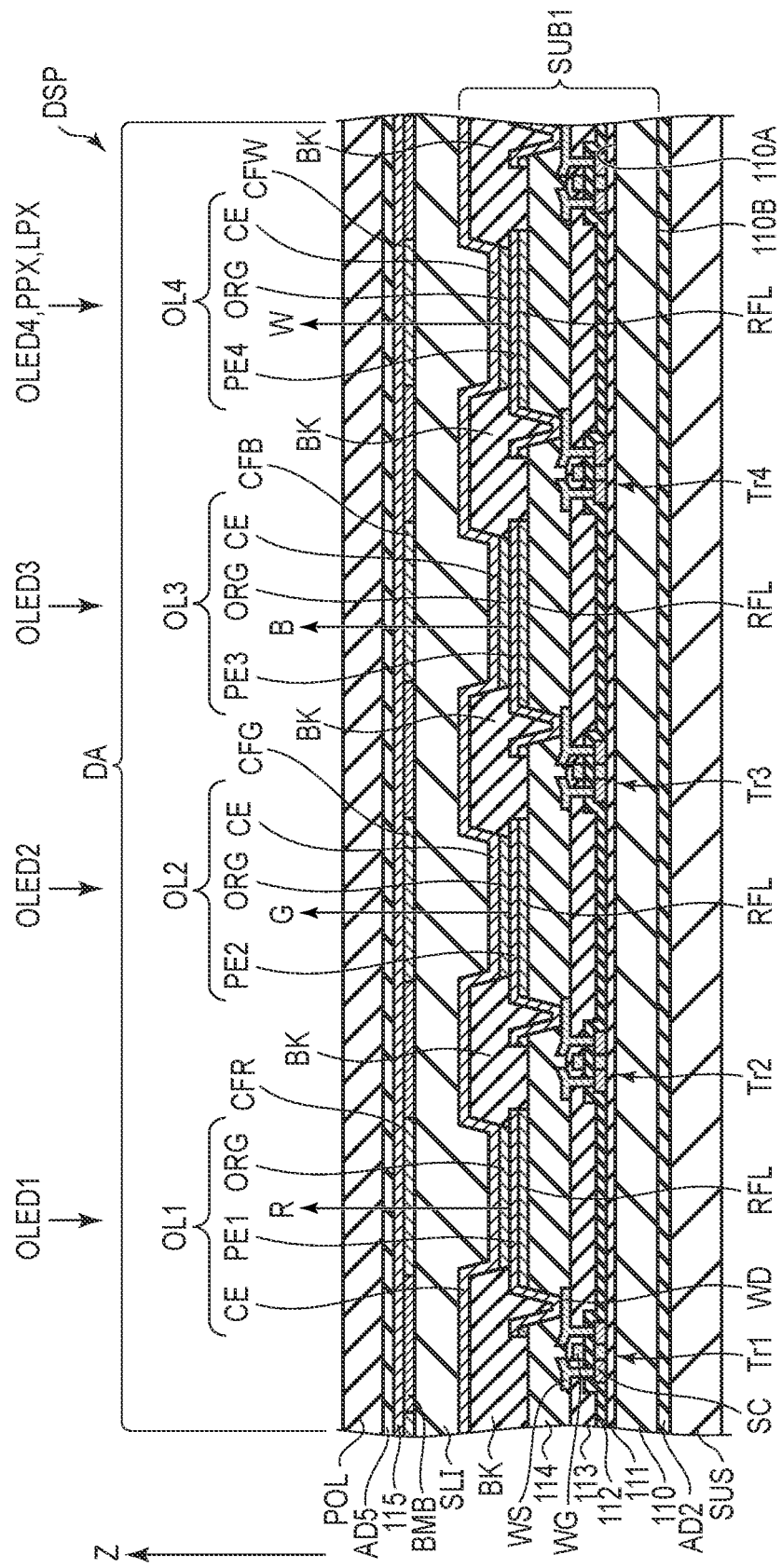
FIG. 23 is a schematic diagram showing a section showing the display portion DA of the display panel DSP shown in FIG. 20.

FIG. 23 is a schematic diagram showing a section showing the display portion DA of the display panel DSP shown in FIG. 20.

As shown in FIG. 23, the first substrate SUB1 comprises a first insulating substrate 110, a transistor Tr1, a transistor Tr2, a transistor Tr3, a transistor Tr4, a light reflective layer RFL, an organic EL element OLED1, an organic EL element OLED2, an organic EL element OLED3, an organic EL element OLED4, a sealing layer SLI, the support member SUS, etc.

The first insulating substrate 110 is formed of an organic insulating material such as polyimide. For this reason, the term "organic insulating substrate (resinous substrate)" may be more appropriate for the first insulating substrate 110. Alternatively, the terms "insulating layer", "organic insulating layer" or "resinous layer" may be more appropriate for the first insulating substrate 110. The first insulating substrate 110 comprises a first surface 110A, and a second surface 110B on the opposite side of the first surface 110A. The first insulating substrate 110 is covered with a first insulating film 111.

The transistors Tr1, Tr2 and Tr3 are formed above the first insulating film 111. In the example shown in the figure, the transistors Tr1, Tr2, Tr3 and Tr4 are configured by top-gate thin-film transistors. However, they may be configured by bottom-gate thin-film transistors. In FIG. 23, the transistors Tr1 to Tr4 are equivalent to the drive transistor DRT of FIG. 22.

As the transistors Tr1, Tr2, Tr3 and Tr4 have the same configuration, hereinafter, this specification focuses on the transistor Tr1 and more specifically explains its configuration. The transistor Tr1 comprises a semiconductor layer SC formed on the first insulating film 111. The semiconductor layer SC is covered with a second insulating film 112. The second insulating film 112 is also provided on the first insulating film 111.

The gate electrode WG of the transistor Tr1 is formed on the second insulating film 112, and is located immediately above the semiconductor layer SC. The gate electrode WG is covered with a third insulating film 113. The third insulating film 113 is also provided on the second insulating film 112.

The first insulating film 111, the second insulating film 112 and the third insulating film 113 are formed of, for example, an inorganic material such as silicon oxide or silicon nitride.

The source electrode WS and the drain electrode WD of the transistor Tr1 are formed on the third insulating film 113. The source electrode WS and the drain electrode WD are electrically connected to the semiconductor layer SC through the respective contact holes which penetrate the second insulating film 112 and the third insulating film 113. The transistor Tr1 is covered with a fourth insulating film 114. The fourth insulating film 114 is also provided on the third insulating film 113. The fourth insulating film 114 is formed of, for example, an organic material such as transparent resin.

The light reflective layer RFL is provided on the fourth insulating film 114. The light reflective layer RFL is formed of a highly light-reflective metal material such as aluminum or silver. The surface of the light reflective layer RFL (in other words, the surface on the polarizer POL side) may be a flat surface, or may be an uneven surface for imparting a scattering property.

Organic EL layers OL1 to OL4 are formed on the fourth insulating film 114. In the example shown in the figure, the organic EL layer OL1 is electrically connected to the transistor Tr1, and the organic EL layer OL2 is electrically connected to the transistor Tr2, and the organic EL layer OL3 is electrically connected to the transistor Tr3, and the organic EL layer OL4 is electrically connected to the transistor Tr4. All of the organic EL layers OL1 to OL4 are configured as a top emission type, which emits light to the polarizer POL side.

In FIG. 23, the combination of the organic EL layer OL1 and the transistor Tr1 is defined as the organic EL element OLED1, and the combination of the organic EL layer OL2 and the transistor Tr2 is defined as the organic EL element OLED2, and the combination of the organic EL layer OL3 and the transistor Tr3 is defined as the organic EL element OLED3, and the combination of the organic EL layer OL4 and the transistor Tr4 is defined as the organic EL element OLED4. When the organic EL elements OLED1 to OLED4 do not need to be especially distinguished from each other, they are simply called organic EL elements OLED.

The organic emitting layers ORG of the organic EL layers OL1 to OL4 emit white light. The emitted light passes through the color filter CF provided on the organic EL layers OL1 to OL4. The light is emitted to the polarizer POL side.

The color filter CF comprises a coloring layer CFR having a first color, a coloring layer CFG having a second color, a coloring layer CFB having a third color and a coloring layer CFW having a fourth color. In the present embodiment, the first color is red (R). The second color is green (G). The third color is blue (B). The fourth color is white (W).

The white light emitted from the organic EL layers OL1 to OL4 passes through the coloring layer CFR, the coloring layer CFG, the coloring layer CFB and the coloring layer CFW which is a transparent resinous layer, and is emitted to the upper side as red light, green light, blue light and white light, respectively.

The pixel PPX and pixels LPX for illumination facing the imaging device 1 comprise a configuration comprising the coloring layer CFW which is a transparent resinous layer, in other words, the same configuration as the organic EL element OLED4.

The organic EL layer OL1 comprises a pixel electrode PE1 formed on the light reflective layer RFL. The pixel electrode PE1 is in contact with the drain electrode WD of the transistor Tr1 and is electrically connected to the transistor Tr1. Similarly, the organic EL layer OL2 comprises a pixel electrode PE2 electrically connected to the transistor Tr2. The organic EL layer OL3 comprises a pixel electrode PE3 electrically connected to the transistor Tr3. The organic EL layer OL4 comprises a pixel electrode PE4 electrically connected to the transistor Tr4. The pixel electrodes PE1, PE2, PE3 and PE4 are formed of, for example, a transparent conductive material such as ITO or IZO.

Partition insulating layers BK are provided on the fourth insulating film 114 and the pixel electrodes PE. In each partition insulating layer BK, an opening portion is provided in a location corresponding to the pixel electrode PE, or a slit is provided in a location corresponding to a column or row formed by the pixel electrodes PE. Here, for example, each partition insulating layer BK comprises an opening portion in a location corresponding to the pixel electrode PE.

The organic EL layers OL1 to OL4 further comprise the organic emitting layer ORG and a common electrode CE. Of each pixel electrode PE and the common electrode CE, one electrode is an anode, and the other one is a cathode. The organic emitting layers ORG are located on the pixel electrodes PE1 to PE4, respectively. Each organic emitting layer ORG is located between adjacent partition insulating layers BK. As described above, the organic emitting layers ORG are organic emitting layers which emit white light.

The emitting element ELM described above is equivalent to the pixel electrode PE, the organic emitting layer ORG and the common electrode CE.

The common electrode CE is located on the organic emitting layers ORG and the partition insulating layers BK. The common electrode CE is formed of, for example, a transparent conductive material such as ITO or IZO. In the example shown in the figure, the organic EL layers OL1 to OL4 are defined by the partition insulating layers BK. It should be noted that, although not shown in the figure, the organic EL layers OL1 to OL4 should be preferably sealed by a transparent sealing film.

In a manner different from that of FIG. 23, each organic EL element OLED may be configured as a bottom emission type, which emits light to the first insulating substrate 110 side. In this case, the configuration is adjusted in various ways, including the location of the light reflective layer RFL.

The sealing layer SLI covers the upper sides of the organic EL layers OL1 to OL4. The sealing layer SLI is formed so as to seal in the members provided between the first insulating substrate 110 and the sealing layer SLI. The sealing layer SLI prevents oxygen and moisture from entering the organic EL layers OL1 to OL4 and prevents the degradation of the organic EL layers OL1 to OL4. The sealing layer SLI may be configured by a stacked layer body of an inorganic film and an organic film.

The coloring layer CFR, the coloring layer CFG, the coloring layer CFB, the coloring layer CFW and light-shielding layers BMB are provided on the sealing layer SLI. The light-shielding layers BMB are provided above the transistors Tr1 to Tr4. The coloring layer CFR is provided on the organic emitting layer ORG of the organic EL element OLED1 between adjacent light-shielding layers BMB. The coloring layer CFG is provided on the organic emitting layer ORG of the organic EL element OLED2 between adjacent light-shielding layers BMB. The coloring layer CFB is provided on the organic emitting layer ORG of the organic EL element OLED3 between adjacent light-shielding layers BMB. The coloring layer CFW is provided on the organic emitting layer ORG of the organic EL element OLED4 between adjacent light-shielding layers BMB.

Although not shown in the figure, the edge portions of the coloring layer CFR and the edge portions of the light-shielding layers BMB, the edge portions of the coloring layer CFG and the light-shielding layers BMB, the edge portions of the coloring layer CFB and the light-shielding layers BMB, and the edge portions of the coloring layer CFW and the light-shielding layers BMB may overlap in the third direction Z.

The pixel PPX and the pixels LPX are configured to comprise the coloring layer CFW which is a transparent resinous layer as described above. The coloring layer CFW of the pixel PPX is equivalent to the opening portion POP described above. The opening portion POP of the present embodiment can be regarded as an opening portion provided between the light-shielding layers BMB of the organic EL elements OLED adjacent to the pixel PPX.

In a manner similar to that of FIG. 10, the pixel PPX may comprise, as the opening portion POP, a plurality of opening portions POP evenly provided within the pixel PPX.

A fifth insulating film 115 is provided on the coloring layer CFR, the coloring layer CFG, the coloring layer CFB, the coloring layer CFW and the light-shielding layers BMB. For example, the fifth insulating film 115 is formed of a resinous material such as polyimide or acrylic. The fifth insulating film 115 may be formed of an inorganic material such as a silicon oxide layer.

The polarizer POL is provided above the fifth insulating film 115. In the present embodiment, the polarizer POL is attached to the fifth insulating film 115 by an adhesive layer AD5. However, in a manner different from that of the present embodiment, a resinous layer or an optical film may be provided between the fifth insulating film 115 and the polarizer POL. A member such as an optical film or a glass substrate may be provided above the polarizer POL.

In this type of display panel DSP, when each of the organic EL elements OLED1 to OLED4 emits light, the light passes through the polarizer POL, etc., and is emitted to the outside. In this way, color display is realized.

It should be noted that the pixels PX shown in FIG. 21 are, for example, the smallest unit of a color image, and comprise the above organic EL elements OLED1 to OLED4.

In FIG. 23, the configuration comprising the organic EL element OLED4 which emits white light is explained. However, the configuration is not limited to this example. The display panel DSP of the present embodiment may not comprise the organic EL element OLED4, and may comprise only the organic EL elements OLED1 to OLED3. Thus, the display panel DSP of the present embodiment may be a display panel consisting of organic EL elements OLED of RGB.

Even if the display panel is formed as a display panel comprising the organic EL elements OLED1 to OLED3, the pixel PPX and the pixels LPX are organic EL elements comprising a coloring layer CFW which is a transparent resinous layer.

FIG. 24 is a timing diagram showing an output example of various types of signals related to a reset operation, an offset cancel operation, a write operation and an emission operation in an organic EL element OLED. Here, this specification mainly explains signals supplied to the control line SRG, the control line SBG, a control line SIG and the control line SSG.

It is assumed that a reset operation and an offset cancel operation in organic EL elements OLED are performed in units of two rows of organic EL elements OLED. In FIG. 24, regarding the control lines electrically connected to the organic EL elements OLED of the target two rows for a reset operation and an offset cancel operation (hereinafter, referred to as the organic EL elements OLED of the first row and the second row), a reset control signal supplied to the control line SRG is shown as RG12, and an output control signal supplied to the control line SBG is shown as BG12.

A pixel control signal supplied to the control line SSG electrically connected to the organic EL elements OLED of the first row is shown as SG1. A pixel control signal supplied to the control line SSG electrically connected to the organic elements OLED of the second row is shown as SG2.

FIG. 24 shows the timing of various types of signals relative to the organic EL elements OLED of the first row to the second row. For example, the same timing is applied to the organic EL elements OLED of the third row and the subsequent rows.

Here, the write operation of voltage Vsig of an image signal is explained.

As shown in FIG. 24, in the case of a write operation, a pixel control signal SG is switched from an L level to an H level.

By this operation, the pixel transistor SST is switched to an on-state. In this case, voltage Vsig of an image signal is written to the gate electrode of the drive transistor DRT through the pixel transistor SST.

After the write operation for the organic EL elements OLED of the first row is completed, a write operation for the organic EL elements OLED of the second row is performed in the same manner. When a write operation for the organic EL elements OLED of the second row is performed, regarding the organic EL elements OLED of the first row, the pixel transistors SST are caused to be in an off-state.

Now, an emission operation for causing the emitting elements ELM to emit light is explained.

As shown in FIG. 24, in the case of an emission operation, a pixel control signal SG is switched from an H level to an L level. By this operation, the pixel transistor SST is switched to an off-state. In this case, based on the potential of the gate electrode of the drive transistor DRT written by the above write operation, the drive transistor DRT is passed through, and current flows in the emitting element ELM, and the emitting element ELM lights up (in other words, the emitting element ELM emits light).

Figure 25:
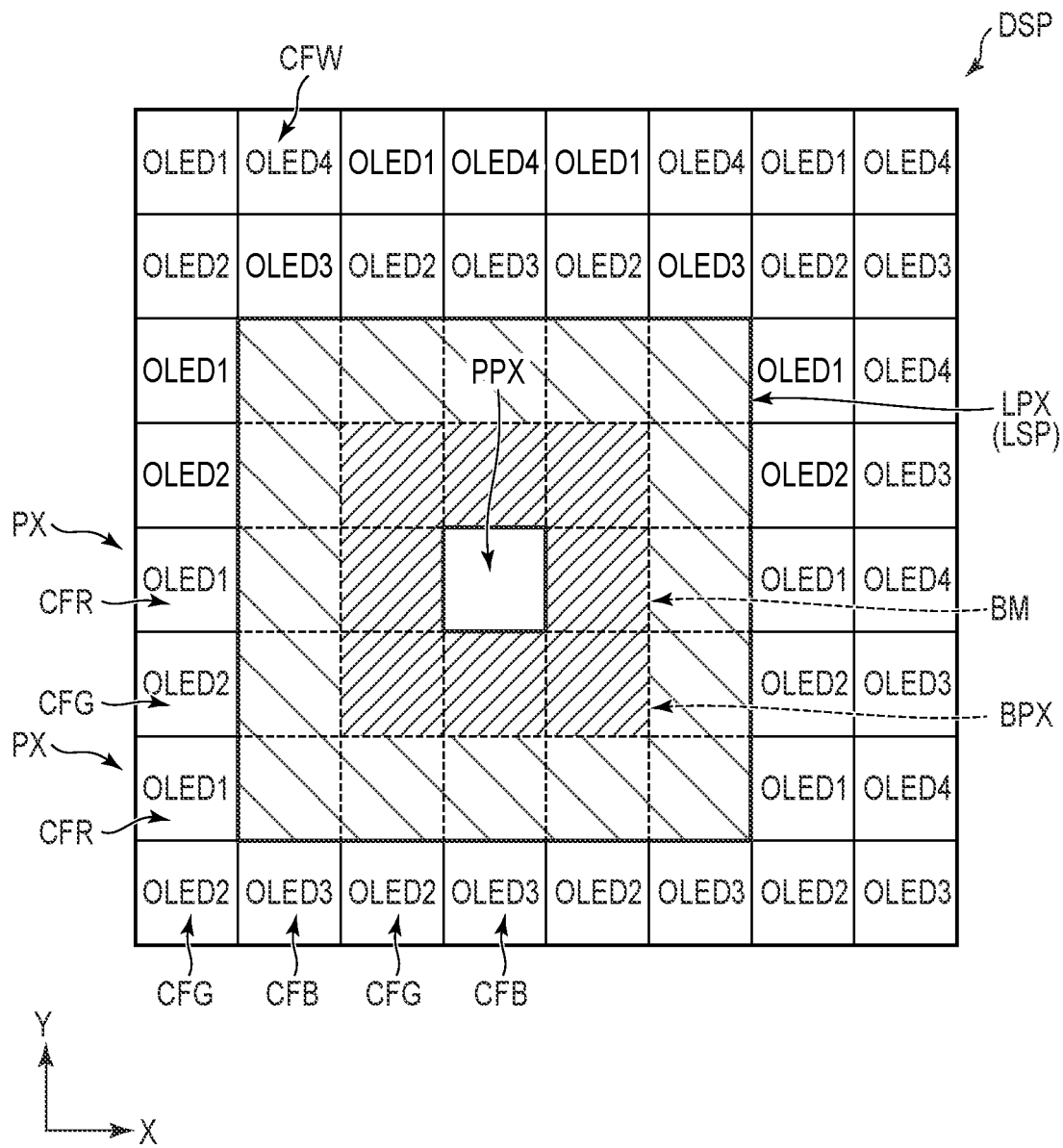
FIG. 25 is a plan view showing a pixel layout.

FIG. 25 is a plan view showing a pixel layout in the present embodiment.

FIG. 25 is equivalent to a layout in which the subpixels SP1 to SP4 of FIG. 17 of embodiment 1 are replaced by the organic EL elements OLED 1 to OLED 4. As the explanation of FIG. 17 can be referred to, the details of the explanation of FIG. 25 are omitted.

Figure 26:
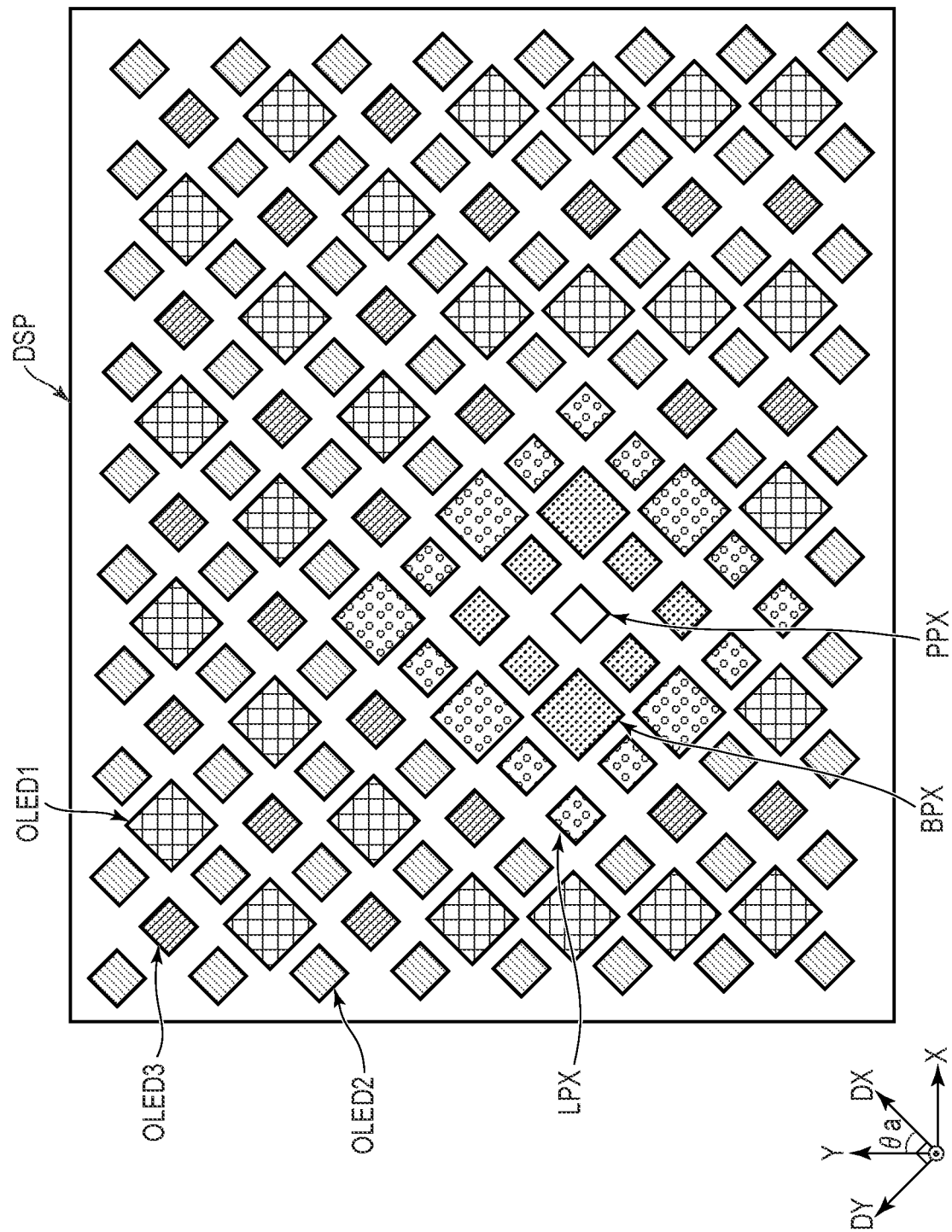
FIG. 26 is another plan view showing a pixel layout.

FIG. 26 is another plan view showing a pixel layout in the present embodiment. FIG. 26 shows a pixel layout comprising the organic EL elements OLED1 to OLED3.

In FIG. 26, a direction intersecting with the second direction Y clockwise at acute angle θa is defined as a direction DX, and a direction perpendicular to the direction DX is defined as a direction DY.

In FIG. 26, each organic EL element OLED1 is adjacent to organic EL elements OLED2 in the direction DX and the direction DY.

The organic EL elements OLED2 are adjacent to each other in the first direction X, and are also adjacent to each other in the second direction Y. Of the organic EL elements OLED2, each organic EL element OLED2 adjacent to each organic EL element OLED1 in the direction DX is adjacent to organic EL elements OLED3 in the direction DY. Of the organic EL elements OLED2, each organic EL element OLED2 adjacent to each organic EL element OLED3 in the direction DX is adjacent to organic EL elements OLED1 in the direction DY.

Each organic EL element OLED3 is adjacent to organic EL elements OLED2 in the direction DX and the direction DY.

In FIG. 26, a pixel PPX occupies an area in which one of the organic EL elements OLED3 is provided. Instead of an area in which an organic EL element OLED3 is provided, the pixel PPX may occupy an area in which one of the organic EL elements OLED1 is provided or an area in which one of the organic EL elements OLED2 is provided.

Pixels BPX are provided so as to be adjacent to the pixel PPX in the direction DX and the direction DY. In FIG. 23, the pixels BPX may not be provided, and pixels LPX may be provided so as to be adjacent to the pixel PPX. Each pixel BPX of FIG. 26 occupies an area in which a single organic EL element OLED is provided.

Pixels LPX are provided so as to be adjacent to the pixels BPX in the direction DX and the direction DY. Each pixel LPX comprises the same configuration as the organic EL element OLED4. A coloring layer CFW is provided in each pixel LPX, and each pixel LPX emits white light. Each pixel LPX in FIG. 23 occupies an area in which a single organic EL element OLED is provided.

The electronic device explained in the present embodiment comprises the pixels LPX each comprising a transparent resinous layer around the pixel PPX comprising an opening portion. From the periphery of the opening portion, white irradiation light is applied to the object via the pixels LPX. By this configuration, the illuminance of the object captured by the imaging device 1 can be increased, and a clear picture can be taken by the imaging device 1.

Configuration Example 1

Figure 27:
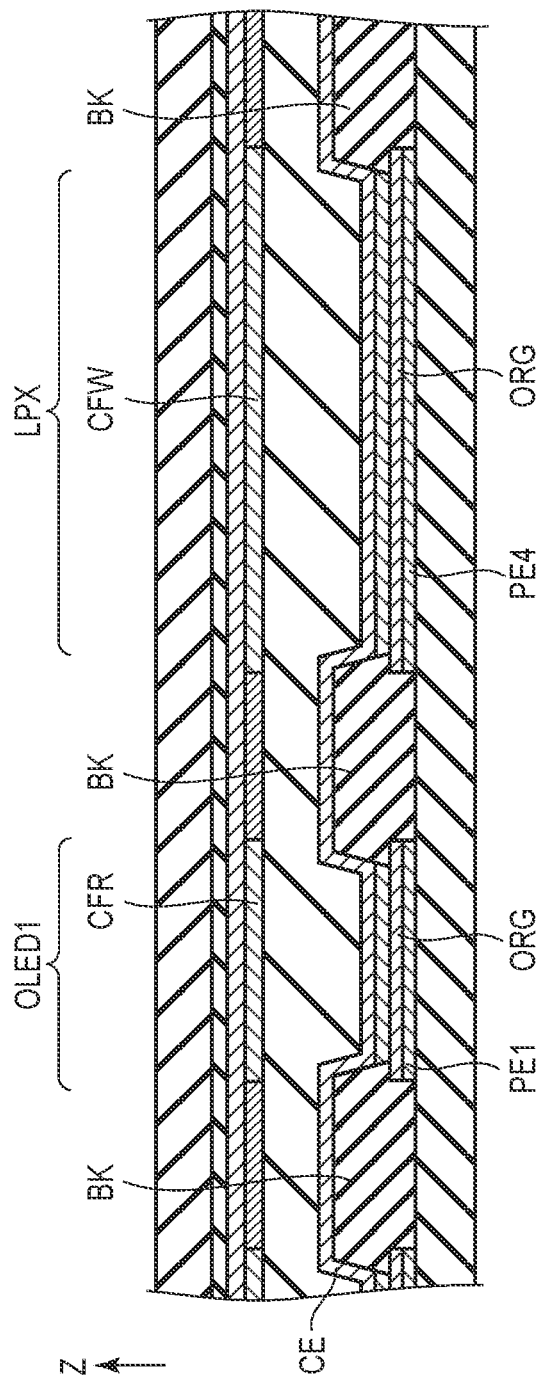
FIG. 27 is a cross-sectional view showing another configuration example of a pixel LPX.

FIG. 27 is a cross-sectional view showing another configuration example of a pixel LPX in the present embodiment. The configuration example shown in FIG. 27 is different from the configuration example shown in FIG. 23 in respect that each pixel LPX is larger than each organic EL element OLED.

FIG. 27 shows the cross-sectional structure of a pixel LPX and an organic EL element OLED1 adjacent to the pixel LPX. In FIG. 27, to simplify explanation, the structure of the part under the pixel electrode PE1 of the organic EL element OLED1 is omitted. The configuration of the pixel LPX is the same as the organic EL element OLED4.

The organic emitting layer ORG of each of the organic EL element OLED1 and the pixel LPX is located between adjacent partition insulating layers BK. As shown in FIG. 27, the interval of the partition insulating layers BK holding the organic emitting layer ORG of the pixel LPX is longer than the interval of the partition insulating layers BK holding the organic emitting layer ORG of the organic EL element OLED1. By this configuration, the ratio of the area of the organic emitting layer ORG of the pixel LPX can be made greater than that of the organic emitting layer ORG of the pixel LPX. In other words, the pixel LPX can be made larger than the organic EL element OLED.

Effects similar to those of the above embodiment can be obtained from this configuration example.

Configuration Example 2

Figure 28:
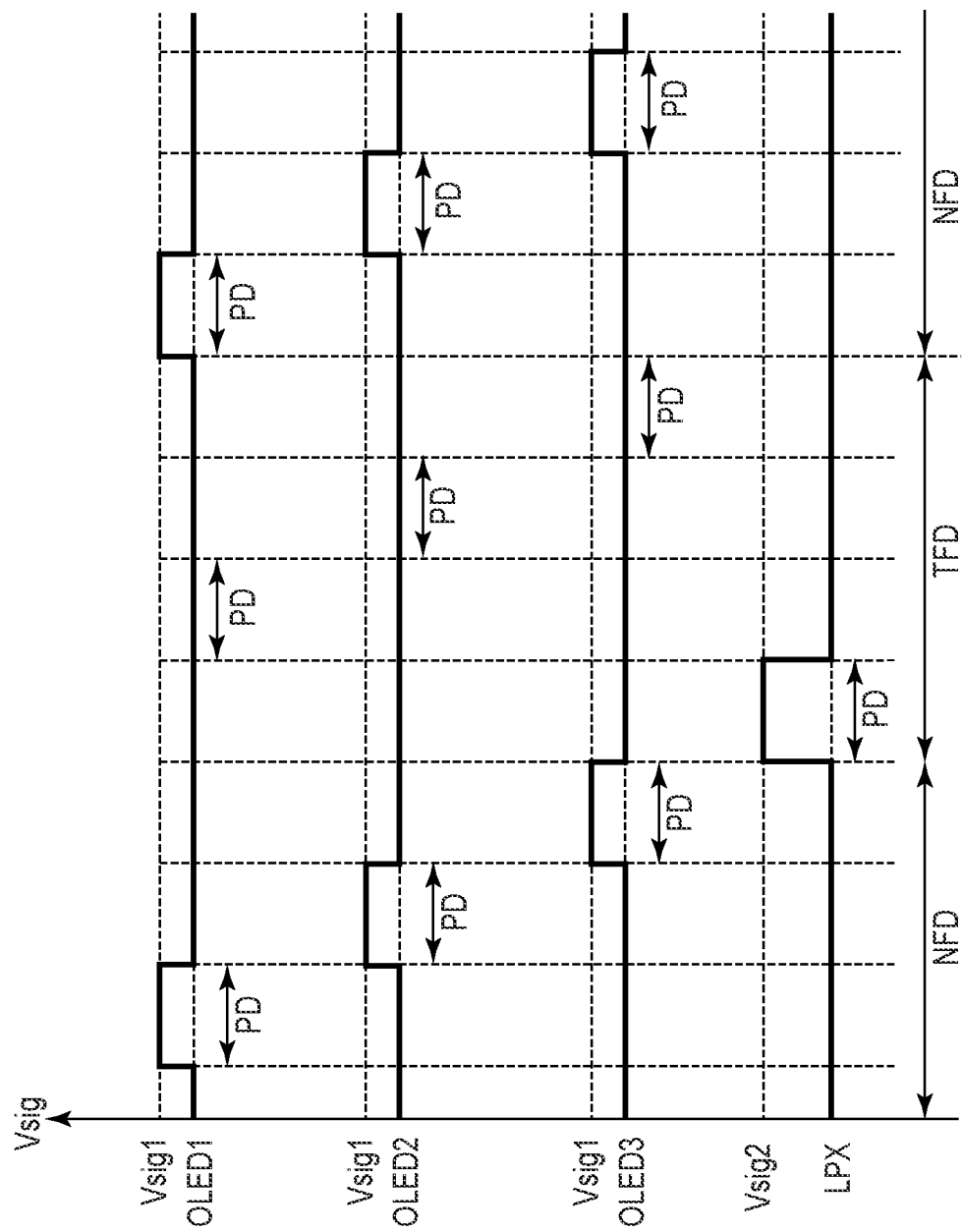
FIG. 28 is a diagram showing voltage Vsig of another configuration example.

FIG. 28 is a diagram showing voltage Vsig of another configuration example in the present embodiment. The configuration example shown in FIG. 28 is different from the configuration example shown in FIG. 25 in respect that the voltage applied to the pixels LPX is greater than the voltage applied to the organic EL elements OLED.

FIG. 28 is a timing diagram showing an output example of the organic EL elements OLED1 to OLED3 and the pixels LPX. Voltage Vsig which is an image signal is written to the organic EL elements OLED1 to OLED3 and the pixels LPX in an emitting period PD.

The organic EL elements OLED1 to OLED3 perform image display by the application of voltage Vsig in a non-capture period NFD (only display). In a capture period TFD, voltage Vsig is not applied to the organic EL elements OLED1 to OLED3.

Each pixel LPX emits light to the object by the application of voltage Vsig in a capture period TFD. Voltage Vsig is not applied to the pixels LPX in a non-capture period NFD.

In this configuration example, in a manner similar to that of configuration example 3 of embodiment 1, voltage Vsig2 of voltage Vsig applied to the pixel transistor SST of each pixel LPX is greater than voltage Vsig1 of voltage Vsig applied to the pixel transistor SST of each organic EL element OLED. By this configuration, voltage Vgs between the source electrode and the gate electrode of the drive transistor DRT of each pixel LPX is made greater than the voltage of each organic EL element OLED. Thus, the amount of current which passes through the drive transistor DRT and flows in the emitting element ELM in each pixel LPX is greater than that in each organic EL element OLED. By the above configuration, the amount of light emission of the pixels LPX is made great, thereby further increasing the illuminance of the object captured by the imaging device 1.

Effects similar to those of the above embodiment can be obtained from this configuration example.

Configuration Example 3

Figure 29:
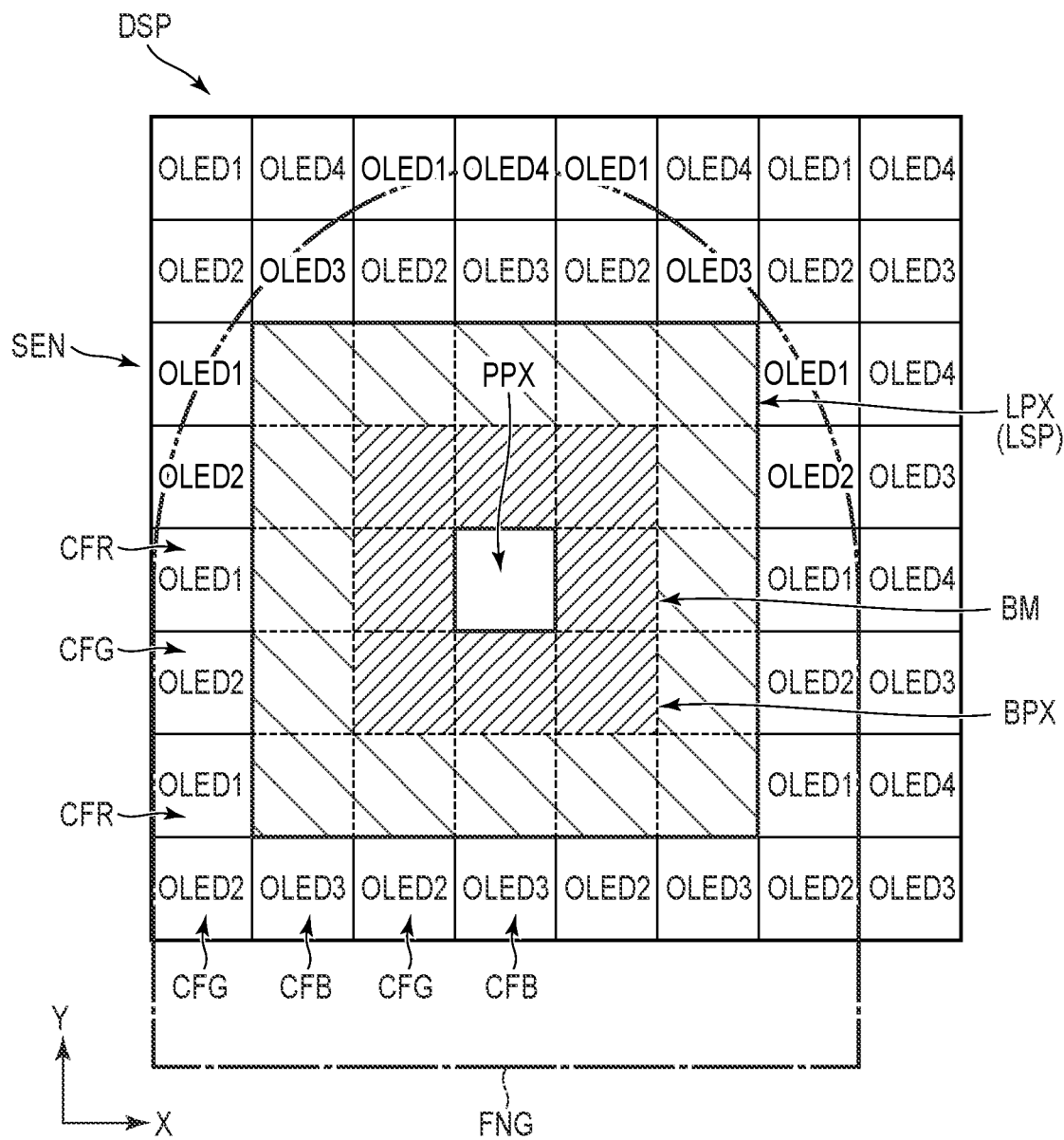
FIG. 29 is a diagram showing another configuration example of the display panel DSP.

FIG. 29 is a diagram showing another configuration example of the display panel DSP of the present embodiment. The configuration example shown in FIG. 29 is different from the configuration example shown in FIG. 25 in respect that the display panel DSP comprises a sensor which detects the approach or contact of an object, and only when an object approaches or contacts the sensor, the luminance of the pixels LPX is increased.

FIG. 29 shows the configuration of the display panel DSP comprising a sensor SEN which detects the approach or contact of an object. The sensor SEN is, similarly to FIG. 15, for example, a capacitive touch sensor, an optical touch sensor or an electromagnetic induction touch sensor. The sensor SEN may be provided inside the display panel DSP, or may be a sensor which is provided outside the display panel DSP and overlaps organic EL elements OLED, pixels LPX and a pixel PPX.

When the sensor SEN detects the approach or contact of an object FNG, as described above, the panel driver PDV applies voltage Vsig such that the luminance (the amount of light emission) of the pixels LPX is greater than the luminance (the amount of light emission) of the pixels PX.

When the sensor SEN does not detect the approach or contact of the object FNG, the panel driver PDV does not apply voltage to the pixels LPX and causes them to be in an off-state. Alternatively, the panel driver PDV applies the same voltage as the pixels PX to the pixels LPX such that normal display is performed.

By providing the sensor SEN, only when the object FNG approaches or contacts the sensor SEN, the pixels LPX can emit illumination light having a high luminance. In other words, in image display in a state in which the object FNG does not approach or contact the sensor SEN, the pixels LPX do not emit illumination light having a high luminance. In this way, the visibility of the display panel DSP is further improved.

In this configuration example, instead of the imaging device 1, a photoreceiver such as a photoelectric conversion element may be provided. Even when a photoreceiver is provided, the luminance of the pixels LPX is great. Thus, the sensitivity of the photoreceiver is increased.

Effects similar to those of the above embodiment can be obtained from this configuration example.

Configuration Example 4

Figure 30:
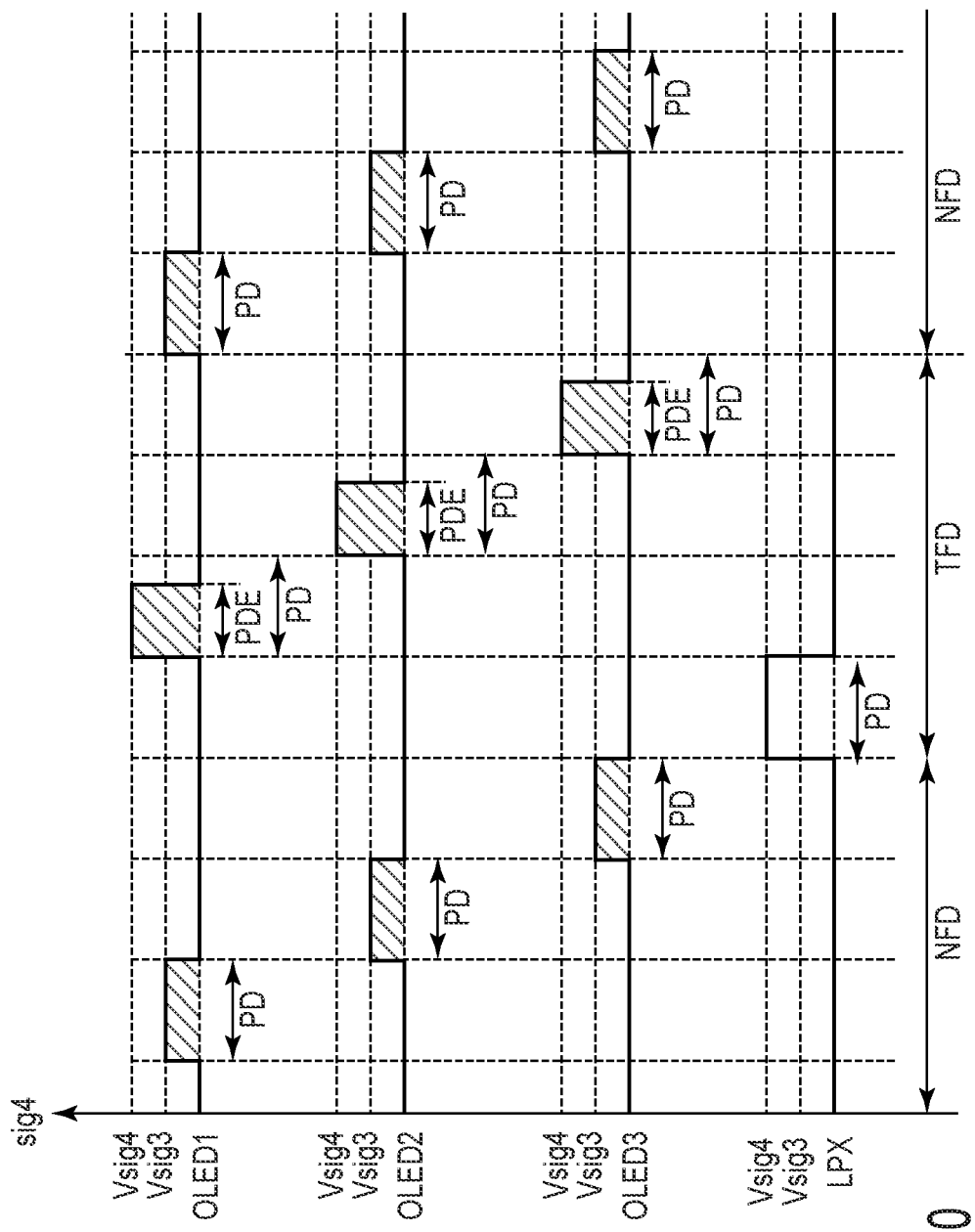
FIG. 30 is a diagram showing another configuration example of the display panel DSP.

FIG. 30 is a diagram showing another configuration example of the display panel DSP of the present embodiment. The configuration example shown in FIG. 30 is different from the configuration example shown in FIG. 28 in respect that the light emission duty ratio of the organic EL elements OLED is decreased so as to be less than that of the pixels LPX of a capture period.

FIG. 30 is a timing diagram showing an output example of the organic EL elements OLED1 to OLED3 and the pixels LPX.

In a non-capture period NFD, voltage Vsig3 which is an image signal is written to the organic EL elements OLED1 to OLED3 in an emitting period PD.

In a non-capture period NFD, voltage Vsig is not applied to the pixels LPX.

In a capture period TFD, voltage Vsig4 which is an image signal is written to the pixels LPX in an emitting period PD. Voltage Vsig4 is greater than voltage Vsig3. In this way, the luminance of the irradiation light applied to an object via the pixels LPX in a capture period can be made greater than that of an image displayed by the organic EL elements OLED.

In a capture period TFD, voltage Vsig4 which is an image signal is written to the organic EL elements OLED1 to OLED3 in a period PDE shorter than an emitting period PD.

The amount of light emission of the organic EL elements (the organic EL elements OLED and the pixels LPX) is equivalent to the product of the application period and the voltage of voltage Vsig. In other words, in each organic EL element OLED in a capture period TFD, the product of a period PDE and voltage Vsig4 (the shaded portions in FIG. 30) is equivalent to the amount of light emission. The period PDE is equivalent to the pulse width of voltage Vsig of the organic EL element OLED. A value obtained by dividing a period PDE by an emitting period PD is equivalent to the light emission duty ratio. In a capture period TFD, the light emission duty ratio of the organic EL elements OLED1 to OLED3 is made less than that of the pixels LPX.

In a manner similar to that of FIG. 14A and FIG. 14B, the configuration in which the luminance of the displayed image changes depending on whether the period is a non-capture period NFD or a capture period TFD is undesirable. Thus, the panel driver PDV determines the length of a period PDE such that the luminance (the amount of light emission) of an object non-capture period is equal to the luminance of an object capture period in the organic EL elements OLED.

In FIG. 30, the length of a period PDE may be determined such that the product of an emitting period PD and voltage Vsig3 is equal to the product of a period PDE and voltage Vsig4.

In this configuration example, the example in which both voltage Vsig and an emitting period PD are changed is explained. However, the configuration is not limited to this example. As long as the change in the luminance of an image between a non-capture period NFD and a capture period TFD is in an acceptable range, only an emitting period may be changed with voltage Vsig held constant.

Effects similar to those of the above embodiment can be obtained from this configuration example.

Configuration Example 5

Figure 31:
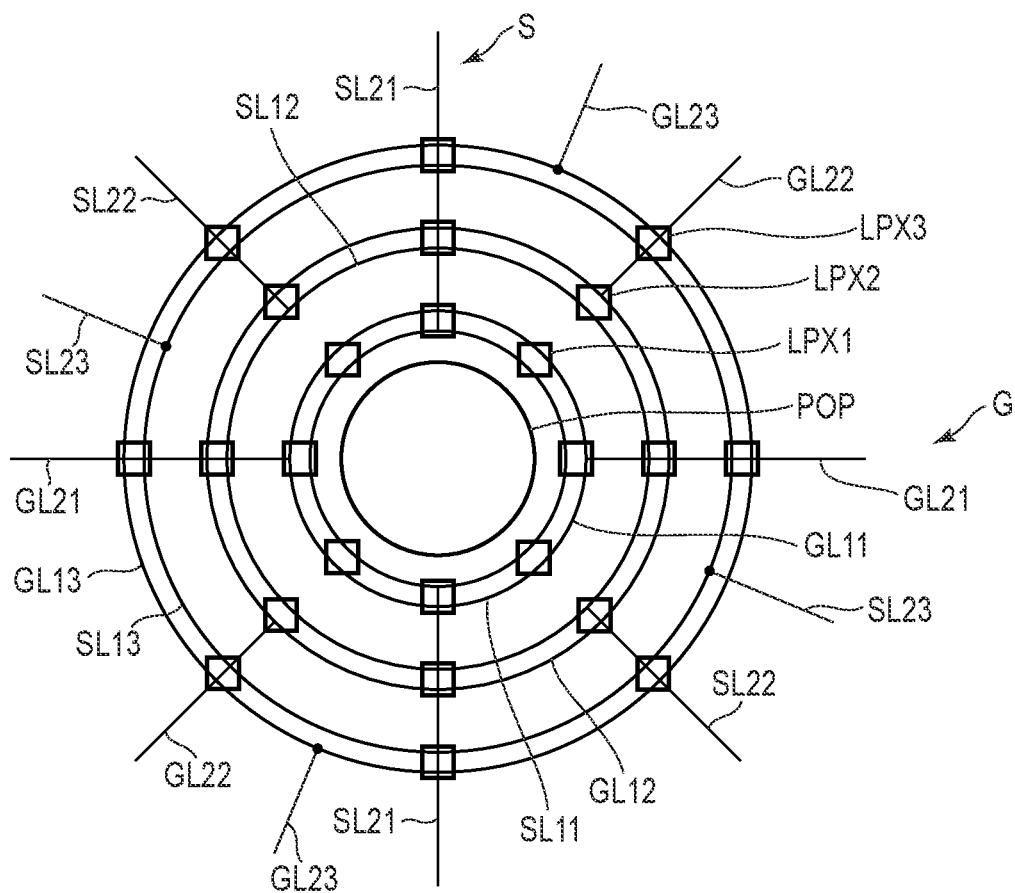
FIG. 31 is a diagram showing another configuration example of a pixel LPX.

FIG. 31 is a diagram showing another configuration example of the pixels LPX of the present embodiment. The configuration example shown in FIG. 31 is different from the configuration example shown in FIG. 21 in respect that a plurality of pixels LPX are driven by the same signal line and the same scanning line.

The signal line S shown in FIG. 31 comprises circular signal lines SL11, SL12 and SL13, and linear signal lines SL21, SL22 and SL23. The scanning line G shown in FIG. 31 comprises circular scanning lines GL11, GL12 and GL13, and linear scanning lines GL21, GL22 and GL23.

When there is no need to distinguish the signal lines SL11, SL12 and SL13 from one another, they are simply referred to as a signal line SL1. When there is no need to distinguish the signal lines SL21, SL22 and SL23 from one another, they are simply referred to as a signal line SL2. When there is no need to distinguish the scanning lines GL11, GL12 and GL13 from one another, they are simply referred to as a scanning line GL1. When there is no need to distinguish the scanning lines GL21, GL22 and GL23 from one another, they are simply referred to as a scanning line GL2.

The signal line S shown in FIG. 31 is equivalent to the image signal line VL shown in FIG. 21 and FIG. 22. The scanning line G is equivalent to the control line SSG shown in FIG. 21 and FIG. 22.

The circular signal lines SL11, SL12 and SL13 are provided concentrically with the opening portion POP as seen in plan view. In this order, the diameter is increased. The circular scanning lines GL11, GL12 and GL13 are provided concentrically with the opening portion POP as seen in plan view. In this order, the diameter is increased. Thus, the scanning line GL1 is provided concentrically with the signal line SL1.

The linear signal line SL21 is electrically connected to the circular signal line SL11. The linear signal line SL22 is electrically connected to the circular signal line SL12. The linear signal line SL23 is electrically connected to the circular signal line SL13.

The linear scanning line GL21 is electrically connected to the circular scanning line GL11. The linear scanning line GL22 is electrically connected to the circular scanning line GL12. The linear scanning line GL23 is electrically connected to the circular scanning line GL13.

Regarding the areas in which the scanning lines G or the signal lines S intersect each other, by electrical connection to another wiring layer via an insulating layer, the intersectional areas may be climbed over.

None of the scanning lines GL1 and GL2 and the signal lines SL1 and SL2 is electrically connected to the other scanning lines G or the other signal lines S. They are independently driven by the panel driver PDV.

Each of the pixels LPX is provided concentrically with the opening portion POP. Of the pixels LPX, each pixel LPX1 is electrically connected to the signal line SL11 and the scanning line GL11. By this configuration, a plurality of pixels LPX1 can be simultaneously driven.

Of the pixels LPX, each pixel LPX2 is electrically connected to the signal line SL12 and the scanning line GL12. By this configuration, a plurality of pixels LPX2 can be simultaneously driven.

Of the pixels LPX, each pixel LPX3 is electrically connected to the signal line SL13 and the scanning line GL13. By this configuration, a plurality of pixels LPX3 can be simultaneously driven.

As shown in FIG. 31, the pixels LPX1, the pixels LPX2 and the pixels LPX3 are provided concentrically with the opening portion POP.

Figure 32:
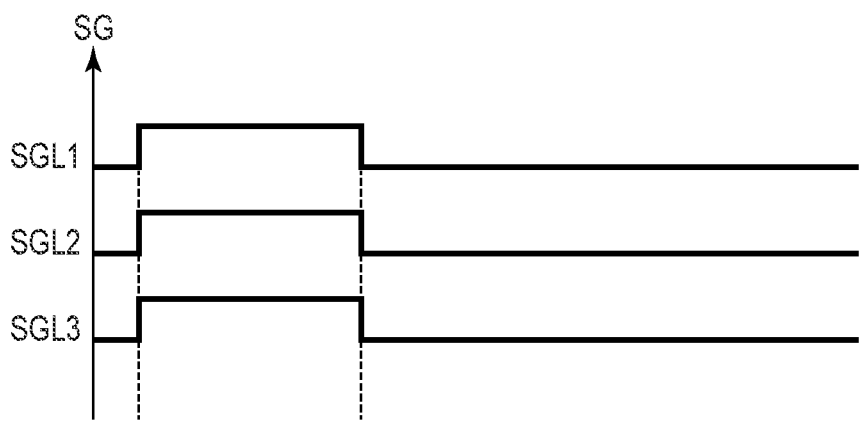
FIG. 32 is a timing diagram showing an output example of a pixel control signal SG supplied to the scanning line G (control line SSG) of a pixel LPX.

FIG. 32 is a timing diagram showing an output example of a pixel control signal SG supplied to the scanning line G (control line SSG) of the pixel LPX. In FIG. 32, the pixel control signals SG of the pixels LPX1, LPX2 and LPX3 are referred to as pixel control signals SG1, SG2 and SG3, respectively.

As shown in FIG. 32, the pulse waveforms of the pixel control signals SG1, SG2 and SG3 are switched from an H level to an L level at the same time, and switched from an L level to an H level at the same time. In this way, the panel driver PDV synchronizes and supplies the image control signals SG of the pixels LPX1, LPX2 and LPX3.

As shown in FIG. 24, the image control signals SG of the organic EL elements OLED are supplied such that they sequentially shifts for each row.

As shown in FIG. 32, by driving the pixel control signals SG of the pixels LPX at the same time, there is no need to provide a circuit for supplying the pixel control signals SG of the pixels LPX to the gate drivers GD1 and GD2 shown in FIG. 21 such that the signals sequentially shift, for example, a shift register. Thus, the circuit configuration of the display panel can be further simplified.

Effects similar to those of the above embodiment can be obtained from this configuration example.

Configuration Example 6

FIG. 33A to FIG. 33D are diagrams showing other configuration examples of the pixel circuit PC of the present embodiment. The configuration examples shown in FIG. 33A to FIG. 33D are different from the configuration example shown in FIG. 22 in respect that some transistors are omitted.

FIG. 33A to FIG. 33D show the pixel circuit PC of a pixel LPX in this configuration example. It should be noted that, in FIG. 33A to FIG. 33D, the output signal of the reset transistor RST is shown as a reset signal RSTG. The output signal of the reset transistor RST is equivalent to the voltage output from the first electrode of the reset transistor RST via the reset line SV.

The pixel circuit PC shown in FIG. 33A is different from the pixel circuit PC shown in FIG. 22 in respect that the output transistor BCT is shared by three pixels LPX. In FIG. 33A, it is assumed that voltage Vsig (image signal) applied to the image signal line VL is in an H level, and the pixel control signal SG and the output control signal BG are also in an H level.

As the potential of the gate electrode of the drive transistor DRT is also in an H level, the drive transistor DRT is passed through, and current flows in the emitting element ELM, and the emitting element ELM emits light.

In the pixel circuit PC shown in FIG. 33A, the output transistor BCT is shared by three pixels LPX. Thus, the number of transistors included in a single pixel LPX is 2.3.

The pixel circuit PC shown in FIG. 33B is different from the pixel circuit PC shown in FIG. 22 in respect that neither the output transistor BCT nor the element capacitance Cled is provided. The matter in which the element capacitance Cled is not provided means that functional capacitance is not generated between the cathode and the anode.

In FIG. 33B, it is assumed that voltage Vsig which is an image signal is in an H level, and the image control signal SG is also in an H level.

As the potential of the gate electrode of the drive transistor DRT is also in an H level, the drive transistor DRT is passed through, and current flows in the emitting element ELM, and the emitting element ELM emits light.

In the pixel circuit PC shown in FIG. 33B, the number of transistors included in a single pixel LPX is two.

The pixel circuit PC shown in FIG. 33C is different from the pixel circuit PC shown in FIG. 22 in respect that none of the output transistor BCT, the element capacitance Cled and the pixel transistor SST is provided.

In FIG. 33C, it is assumed that voltage Vsig which is an image signal is in an H level.

As the potential of the gate electrode of the drive transistor DRT is also in an H level, the drive transistor DRT is passed through, and current flows in the emitting element ELM, and the emitting element ELM emits light. At this time, as the drive transistor DRT is directly connected to the first power line VDDL, current corresponding to potential PVDD flows in the emitting element ELM.

In the pixel circuit PC shown in FIG. 33C, the number of transistors included in a single pixel LPX is one.

The pixel circuit PC shown in FIG. 33D is different from the pixel circuit PC shown in FIG. 22 in respect that none of the elements which control current flowing in the emitting element ELM is provided.

In the pixel circuit PC shown in FIG. 33D, the emitting element ELM is controlled by a signal input from the outside. For example, the emitting element ELM may be directly connected to the panel driver PDV and controlled by a signal directly input from the panel driver PDV. Alternatively, the emitting element ELM may be controlled by a further external driver element from the panel driver PDV.

In FIG. 33A to FIG. 33D, this specification assumes that all of the transistors described above are N-ch TFTs. However, in a manner similar to that of FIG. 22, for example, the transistors other than the drive transistor DRT may be P-ch TFTs, or both N-ch TFTs and P-ch TFTs may be provided.

The drive transistor DRT may be a P-ch TFT. In this case, current should be caused to flow in the emitting element ELM in the opposite direction of this configuration example. The potential level of the above signals should be the opposite polarity. For example, if the level is an H level, it should be changed to an L level.

Effects similar to those of the above embodiment can be obtained from this configuration example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in embodiment 2, a display panel using an organic EL element is mainly explained. However, the display panel of the present embodiment may be a micro LED display panel, etc., instead of an organic EL element.

In the embodiments described above, each pixel PPX, each pixel LPX and each pixel PX are equivalent to a first pixel, a second pixel and a third pixel, respectively. Further, each subpixel LSP and each subpixel SP may be also equivalent to the second pixel and the third pixel, respectively.

The organic EL elements OLED1 to OLED4 are equivalent to the third pixels. It should be noted that, of the organic EL elements OLED4, the elements which function as a pixel PPX and a pixel LPX are equivalent to the first pixel and the second pixel, respectively.

What is claimed is:

1. An electronic device comprising:
    an imaging device; and
    a liquid crystal panel comprising a display portion overlapping the imaging device, wherein
    the liquid crystal panel comprises:
    a first pixel overlapping the imaging device;
    an opening portion provided in the first pixel;
    a second pixel adjacent to the first pixel; and
    a third pixel adjacent to the second pixel,
    the third pixel comprises a first coloring layer, a second coloring layer and a third coloring layer, and
    the second pixel does not comprise the coloring layer or comprises a transparent resinous layer.
2. The electronic device according to claim 1, further comprising a light-shielding layer, wherein
    the opening portion is provided in the light-shielding layer.
3. The electronic device according to claim 1, wherein
    the opening portion provided in the first pixel comprises a plurality of opening portions.
4. The electronic device according to claim 1, wherein
    the second pixel is larger than the third pixel.
5. The electronic device according to claim 1, wherein
    the liquid crystal panel further comprises:
    a plurality of signal lines;
    a plurality of scanning lines; and
    a plurality of transistors, each of the transistors is electrically connected to one of the signal lines and one of the scanning lines, each of the second pixel and the third pixel comprises one of the transistors, and an image signal supplied to the transistor of the second pixel via one of the signal lines is greater than an image signal supplied to the transistor of the third pixel via one of the signal lines.

6. The electronic device according to claim 5, further comprising an illumination device which illuminates the liquid crystal panel, wherein the illumination device comprises a light source, and in a capture period by the imaging device, a luminance of the light source is less than a non-capture period, and the image signal supplied to the transistor of the second pixel is greater than the image signal supplied to the transistor of the third pixel.

7. The electronic device according to claim 1, wherein the liquid crystal panel further comprises:

a plurality of signal lines;

a plurality of scanning lines; and a plurality of transistors, each of the transistors is electrically connected to one of the signal lines and one of the scanning lines, each of the second pixel and the third pixel comprises one of the transistors, a sensor which detects approach or contact of an object is further provided inside or so as to overlap the liquid crystal panel, and when the sensor detects approach or contact of an object, an image signal greater than the transistor of the third pixel is supplied to the transistor of the second pixel.

8. The electronic device according to claim 1, wherein the liquid crystal panel further comprises:

a plurality of signal lines;

a plurality of scanning lines; and a plurality of transistors, each of the transistors is electrically connected to one of the signal lines and one of the scanning lines, the liquid crystal panel comprises the second pixels, and the transistors of the second pixels are electrically connected to the same signal line and the same scanning line.

9. The electronic device according to claim 8, wherein the second pixels are provided concentrically with the opening portion.

10. An electronic device comprising:

an imaging device; and an organic EL panel comprising a display portion overlapping the imaging device, wherein the organic EL panel comprises:

a first pixel overlapping the imaging device;

an opening portion provided in the first pixel;

a second pixel adjacent to the first pixel; and a third pixel adjacent to the second pixel, the third pixel comprises a first coloring layer, a second coloring layer and a third coloring layer, and the second pixel comprises a transparent resinous layer.

11. The electronic device according to claim 10, further comprising a light-shielding layer, wherein the opening portion is provided in the light-shielding layer.

12. The electronic device according to claim 10, wherein the opening portion provided in the first pixel comprises a plurality of opening portions.

13. The electronic device according to claim 10, wherein the second pixel is larger than the third pixel.

14. The electronic device according to claim 10, wherein the organic EL panel further comprises:

a plurality of signal lines;

a plurality of scanning lines; and a plurality of transistors, each of the transistors is electrically connected to one of the signal lines and one of the scanning lines, each of the second pixel and the third pixel comprises one of the transistors, and an image signal supplied to the transistor of the second pixel via one of the signal lines is greater than an image signal supplied to the transistor of the third pixel via one of the signal lines.

15. The electronic device according to claim 14, wherein in a capture period by the imaging device, a light emission duty ratio of the image signal supplied to the transistor of the third pixel is less than a light emission duty ratio of the image signal supplied to the transistor of the second pixel.

16. The electronic device according to claim 10, wherein the organic EL panel further comprises:

a plurality of signal lines;

a plurality of scanning lines; and a plurality of transistors, each of the transistors is electrically connected to one of the signal lines and one of the scanning lines, each of the second pixel and the third pixel comprises one of the transistors, a sensor which detects approach or contact of an object is further provided inside or so as to overlap the organic EL panel, and when the sensor detects approach or contact of an object, an image signal greater than the transistor of the third pixel is supplied to the transistor of the second pixel.

17. The electronic device according to claim 10, wherein the organic EL panel further comprises:

a plurality of signal lines;

a plurality of scanning lines; and a plurality of transistors, each of the transistors is electrically connected to one of the signal lines and one of the scanning lines, the organic EL panel comprises the second pixels, and the transistors of the second pixels are electrically connected to the same signal line and the same scanning line.

18. The electronic device according to claim 17, wherein the second pixels are provided concentrically with the opening portion.

* * * * *